(12) United States Patent
Amin et al.

(10) Patent No.: US 11,487,032 B2
(45) Date of Patent: Nov. 1, 2022

(54) CHARACTERIZING LOW-PERMEABILITY RESERVOIRS BY USING NUMERICAL MODELS OF SHORT-TIME WELL TEST DATA

(71) Applicant: Saudi Arabian Oil Company, Dhahran (SA)

(72) Inventors: Rana Shahzad Amin, Dhahran (SA); Bandar A. Wehaibi, Dammam (SA); Noor M. Anisur Rahman, Dhahran (SA)

(73) Assignee: Saudi Arabian Oil Company, Dhahran (SA)

( * ) Notice: Subject to any disclaimer, the term of this patent is extended or adjusted under 35 U.S.C. 154(b) by 132 days.

(21) Appl. No.: 16/513,452

(22) Filed: Jul. 16, 2019

(65) Prior Publication Data

US 2021/0018637 A1    Jan. 21, 2021

(51) Int. Cl.
*G01V 1/28* (2006.01)
*G06F 30/20* (2020.01)

(52) U.S. Cl.
CPC .............. *G01V 1/282* (2013.01); *G06F 30/20* (2020.01)

(58) Field of Classification Search
CPC ........ G01V 1/282; G01V 99/00; G06F 30/20; G06F 30/28; E21B 2200/20; E21B 2200/14; E21B 49/008
See application file for complete search history.

(56) References Cited

U.S. PATENT DOCUMENTS 10,094,202 B2 * 10/2018 Nooruddin .......... E21B 41/0092
2005/0116709 A1 * 6/2005 Proett .................. G01N 24/081
324/303

(Continued)

FOREIGN PATENT DOCUMENTS

EP          3101225          12/2016

OTHER PUBLICATIONS

Kamal, M. M., Y. Pan, and J. L. Landa. "Numerical Well Testing: A Method to Use Transient Testing Results in Reservoir Simulation. paper SPE 95905 presented at SPE Annual Technical Conference and Exhibition. Dallas, Texas, 9-12." (2005). (Year: 2005).*

(Continued)

*Primary Examiner* — Eunhee Kim
(74) *Attorney, Agent, or Firm* — Fish & Richardson P.C.

(57) ABSTRACT

Systems and methods include a computer-implemented method for characterizing low-permeability reservoirs by using numerical models. A numerical model modeling production of a well is prepared using reservoir data and well data. The numerical model is updated, including adjusting numerical model properties, until results of performing a quality assurance/quality control check indicate that the numerical model is within acceptable limits. Pressure derivatives are extracted from a transient test to create a functional numerical model. Simulations are run on the functional numerical model and reservoir features and properties are adjusted until acceptable results are achieved on: 1) a pressure match between pressures modeled in the functional numerical model and transient pressures of the well, and 2) a log-log plot derivative match between a pressure derivative of the functional numerical model and a pressure derivative of the transient pressures of the well. A simulation output that is based on the simulations is provided.

20 Claims, 13 Drawing Sheets

(56) References Cited

U.S. PATENT DOCUMENTS

| | | | |
|---|---|---|---|
| 2005/0149307 A1* | 7/2005 | Gurpinar | G06Q 10/06 703/10 |
| 2007/0016389 A1* | 1/2007 | Ozgen | E21B 47/00 703/10 |
| 2011/0130966 A1 | 6/2011 | Zhan et al. | |
| 2013/0096896 A1* | 4/2013 | Al-Shahri | E21B 43/00 703/10 |
| 2014/0257706 A1* | 9/2014 | Biterge | G01V 3/18 702/13 |
| 2015/0276978 A1* | 10/2015 | Dupuy | G01V 99/005 702/11 |
| 2016/0061008 A1* | 3/2016 | Al-Turki | G06F 9/485 703/10 |
| 2016/0201452 A1* | 7/2016 | Anisur Rahman | E21B 47/06 702/13 |
| 2017/0234121 A1* | 8/2017 | Anisur Rahman | E21B 49/008 166/250.07 |
| 2017/0285221 A1* | 10/2017 | Kayode | G01V 99/005 |
| 2019/0017353 A1 | 1/2019 | Nooruddin et al. | |
| 2019/0179873 A1* | 6/2019 | Schirrmann | G06F 17/18 |

OTHER PUBLICATIONS

PCT International Search Report and Written Opinion in International Appln. No. PCT/US2020/041970, dated Oct. 28, 2020, 15 pages.

Jackson et al., "Advances in Multilayer Reservoir Testing and Analysis using Numerical Well Testing and Reservoir Simulation," SPE 62917, SPE Annual Technical Conference and Exhibition, Dallas, Texas, Oct. 1-4, 2000, 14 page.

Mijinyawa et al., "An integrated approach to well test analysis—use of numberical simulation for complex reservoir systems," SPE 140617, 34th SPE Annual Conference and Exhibiton in Tinapa, Calabar, Nigheria, Jul. 31-Aug. 7, 2010, 11 pages.

Zhao et al., "A Well Tested Analysis Methodology and Application for Tight Reservoirs," Offshore Conference Asia held in Kuala Lumpur, Department of Petroleum Engineering, China University of Petroleum—Beijing, Mar. 22-25, 2016, 11 pages.

Zhu et al., "Analyzing Transient Pressure and Rate Responses of Tight Oil Reservoirs Using Comparative Numerical, Analytical and Semi-Analytical Methods," SPE Asia Pacific Hydraulic Fracturing Conference, Aug. 24-26, 2016, 29 pages.

GCC Examination Report in Gulf Cooperation Council Appln. No. GC 2020-40097, dated Sep. 4, 2021, 4 pages.

* cited by examiner

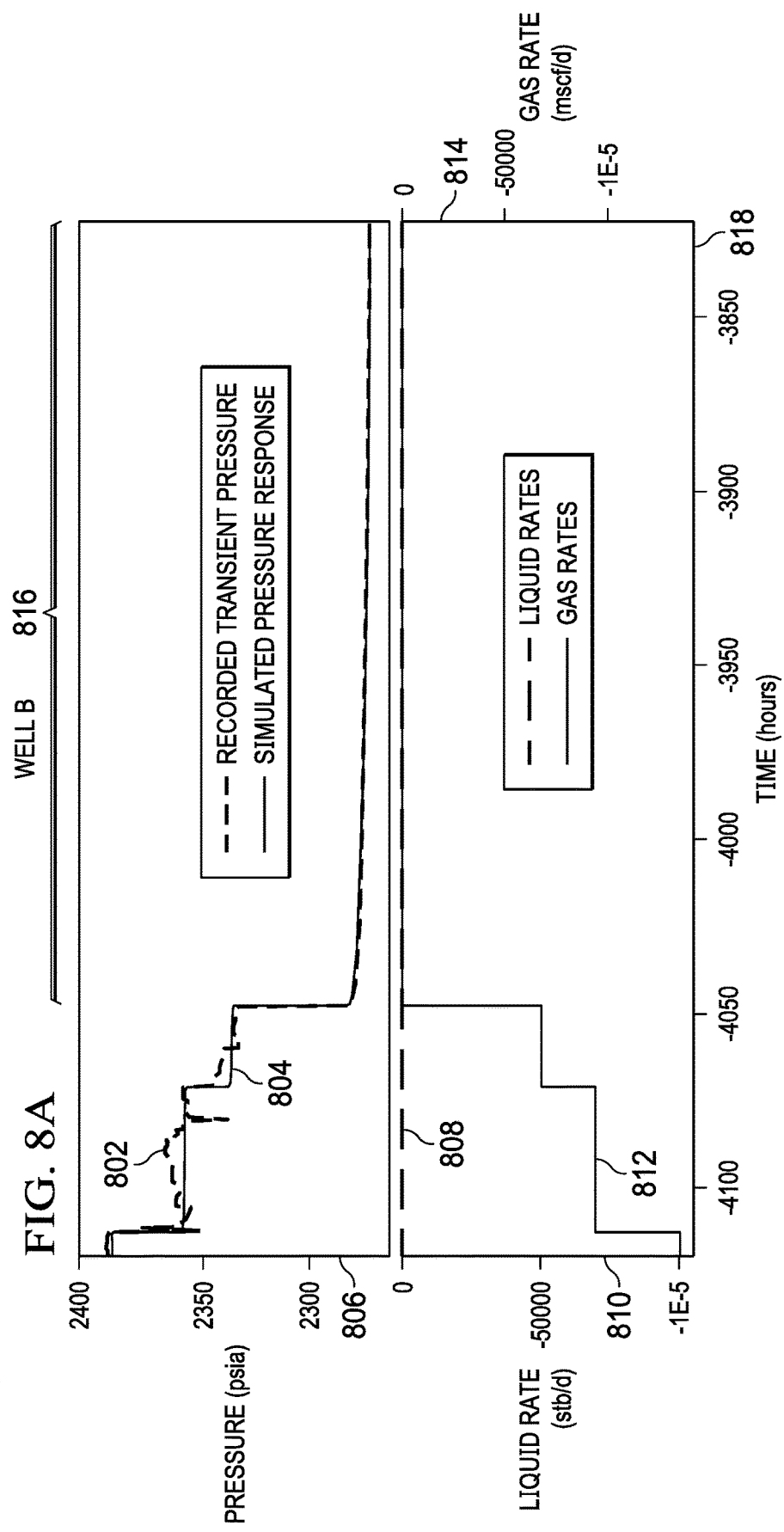

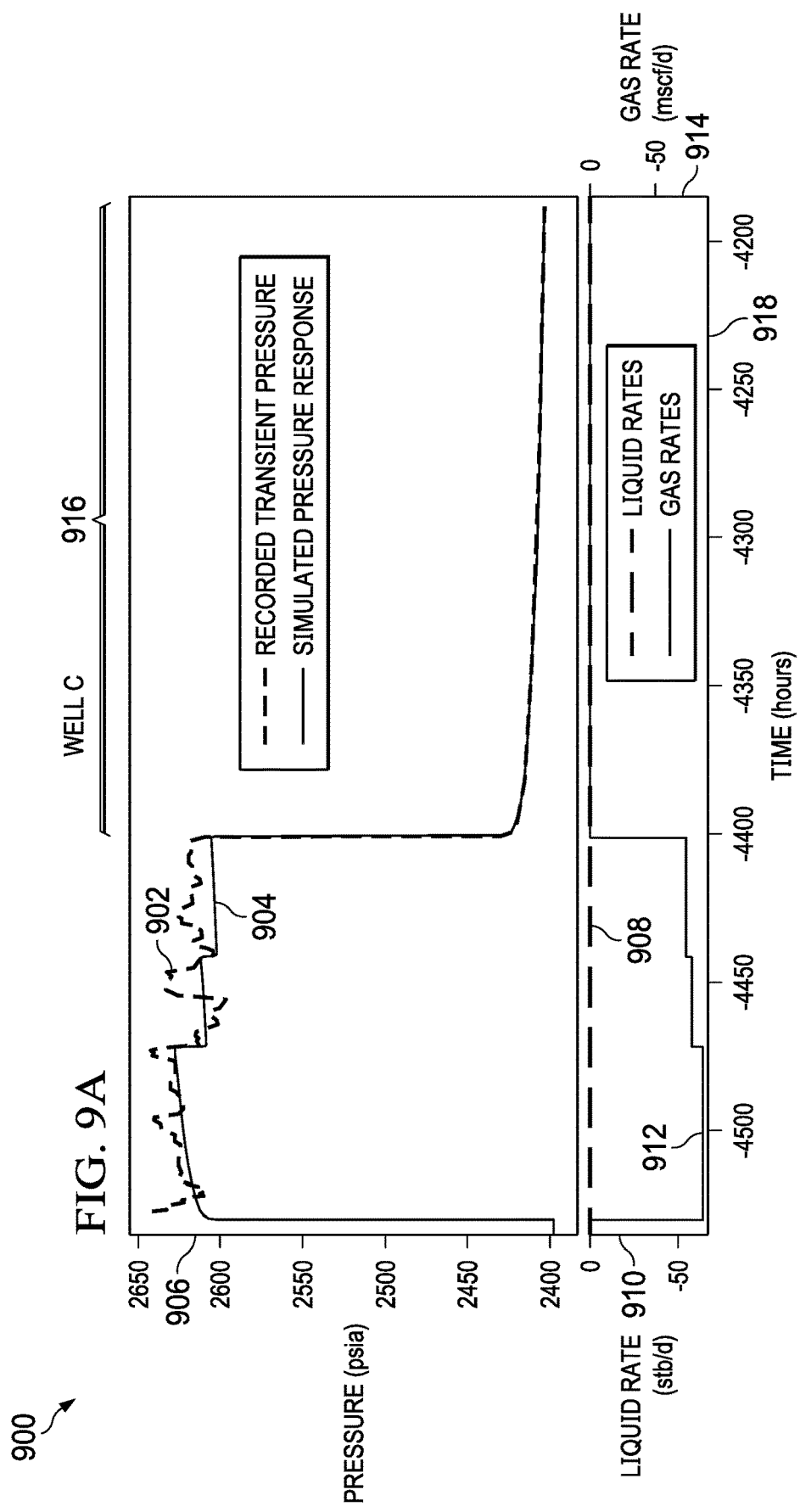

CHARACTERIZING LOW-PERMEABILITY RESERVOIRS BY USING NUMERICAL MODELS OF SHORT-TIME WELL TEST DATA

BACKGROUND

The present disclosure applies to characterizing wells, such as oil and gas wells. Low-permeability (or "tight") oil reservoirs have recently become significant sources of hydrocarbon supply. Running long build-up tests in production and exploration wells can be difficult to justify due to concerns regarding loss of production or the expense of onsite hardware. As a result, pressure-transient analysis is typically performed with the insufficient data gathered during a build-up test. In conventional transient analysis, a priori knowledge of the flow capacity from the infinite-acting radial flow is needed to build a model using the test data. In tight reservoirs, it is unlikely that there is enough data in the subject well to have established a late radial flow regime. In such cases, the flow capacity of offset wells is sometimes used to analyze data from short build-up or fall-off tests. However, the flow capacity values in the offset wells are often not available, especially in exploration wells, which can cause a great deal of uncertainty in data analyses.

SUMMARY

The present disclosure describes techniques for using numerical models of short-time well test data to characterize low-permeability reservoirs. For example, techniques described in the present disclosure can allow practitioners to characterize reservoirs using less data without a priori knowledge of flow capacity.

In some implementations, a computer-implemented method for characterizing low-permeability reservoirs by using numerical models includes the following. A numerical model modeling production of a well is prepared using reservoir data and well data associated with the well. The numerical model is updated, including adjusting properties used for the numerical model, until results of performing a quality assurance/quality control (QA/QC) check on the numerical model indicate that the numerical model is within acceptable limits. Pressure derivatives are extracted from a transient test of the well to create a functional numerical model from the numerical model. Simulations are run on the functional numerical model and reservoir features and properties are adjusted until acceptable results are achieved on: 1) a pressure match between pressures modeled in the functional numerical model and transient pressures of the well, and 2) a log-log plot derivative match between a pressure derivative of the functional numerical model and a pressure derivative of the transient pressures of the well. A simulation output that is based on the simulations is provided.

The previously described implementation is implementable using a computer-implemented method; a non-transitory, computer-readable medium storing computer-readable instructions to perform the computer-implemented method; and a computer-implemented system, including a computer memory interoperably coupled with a hardware processor configured to perform the computer-implemented method/ the instructions stored on the non-transitory, computer-readable medium.

The subject matter described in this specification can be implemented in particular implementations, so as to realize one or more of the following advantages. First, flow capacities do not need to be known a priori on log-log plots before starting analysis of low-permeability wells. Second, uncertainty can be reduced in cases in which flow capacity values are unknown without the late radial flow regime in the data. Third, techniques can provide flexibility in accommodating complex well and reservoir configurations because numerical reservoir models can improve the understanding of the behavior of wells and reservoirs. Fourth, numerical models can be built using observed dynamic data, such as measured pressures and production rates from well tests, which are performed under actual oilfield operating conditions.

The details of one or more implementations of the subject matter of this specification are set forth in the Detailed Description, the accompanying drawings, and the claims. Other features, aspects, and advantages of the subject matter will become apparent from the Detailed Description, the claims, and the accompanying drawings.

DESCRIPTION OF DRAWINGS

FIG. 8A is a graph showing examples of a Cartesian plot of recorded test data and matched simulation pressure for Well B, according to some implementations of the present disclosure.

FIG. 9A is a graph showing examples of a Cartesian plot of recorded test data and matched simulation pressure for Well C, according to some implementations of the present disclosure.

Like reference numbers and designations in the various drawings indicate like elements.

DETAILED DESCRIPTION

Figure 1:
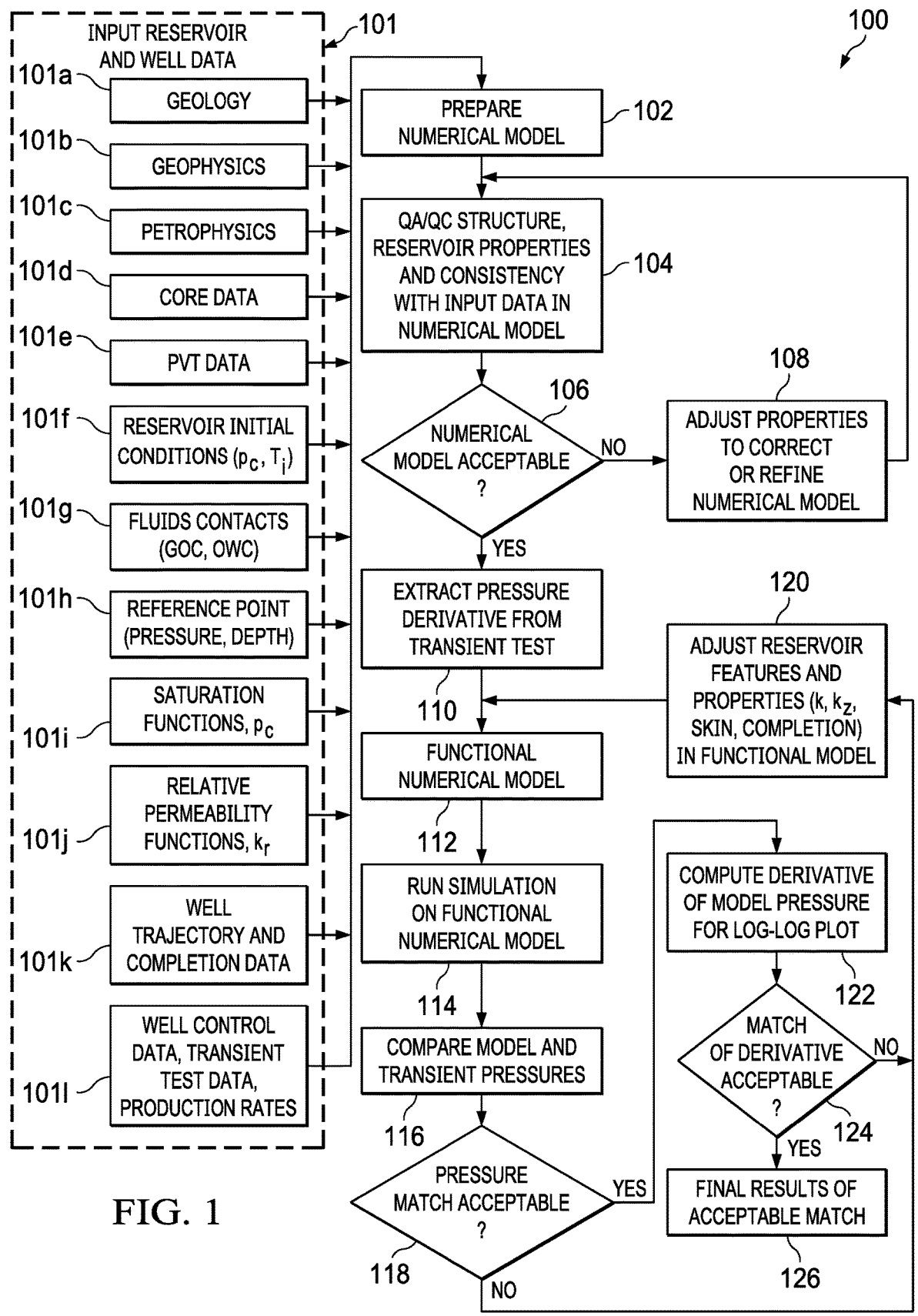
FIG. 1 is a flow diagram of a workflow for using numerical models of short-time well test data to characterize low-permeability reservoirs, according to some implementations of the present disclosure.

The following detailed description describes techniques for using numerical models of short-time well test data to characterize low-permeability reservoirs. Various modifications, alterations, and permutations of the disclosed implementations can be made and will be readily apparent to those of ordinary skill in the art, and the general principles defined may be applied to other implementations and applications, without departing from scope of the disclosure. In some instances, details unnecessary to obtain an understanding of the described subject matter may be omitted so as to not obscure one or more described implementations with unnecessary detail and inasmuch as such details are within the skill of one of ordinary skill in the art. The present disclosure is not intended to be limited to the described or illustrated implementations, but to be accorded the widest scope consistent with the described principles and features.

In conventional transient analysis techniques, flow capacity of the transient data needs to be defined in advance. For conventional available pressure transient techniques, this requirement is typically difficult to meet in tight reservoirs. In short build-up or fall-off tests, due to time constraints or operational reasons, the well cannot be shut-in for long enough to capture the late radial flow regime. Such a situation may also arise when the reservoir permeability is low. For example, without first defining flow capacity, transient data cannot be analyzed to characterize the reservoir. Current conventional techniques for analyzing the transient data for reservoir characterization can experience limitations and compromises, especially in tight reservoirs and exploration fields, or in a well in which only short build-up or fall-off data is available. In these cases, a late radial flow regime may not be achieved, and selection of flow capacity cannot be accurately determined in the absence of supporting data. Further, if flow capacity values are selected, then the analysis can be compromised. Using the techniques described in the present disclosure, transient data can be analyzed, and reservoir characterization can be performed on different kinds of transient data. Moreover, the techniques can also be applied in cases in which sufficient data has been obtained and flow capacity is known.

In some implementations, techniques for using numerical models of short-time well test data to characterize low-permeability reservoirs can be based on building numerical reservoir models (or numerical models). The numerical models can provide flexibility in accommodating complex well and reservoir configurations. The numerical models can also improve the understanding of the behavior of wells and reservoirs. Building numerical models can use reservoir and well data, and can optionally include data from offset wells in addition to data from a subject well. Numerical models that are built for different kinds of reservoirs, including homogeneous and heterogeneous reservoirs, can be based on the reservoir description and properties. After building a numerical model, transient and production data can be incorporated into the numerical model. Each grid block in a numerical model can be subject to satisfaction of rigorous material balance calculations to account for diffusion of pressure accounting for permeability, saturation, porosity, and relevant fluid properties.

Simulations can be run directly using the numerical model. Using comparisons between simulation responses and recorded transient-pressure data, simulation model properties can be adjusted to replicate (and better represent) the responses of the recorded transient-pressure data. The properties of the numerical model can be iteratively refined or adjusted until an acceptable match between the pressure responses of the numerical reservoir model and the actually-recorded transient pressure data is achieved. After achieving an acceptable match between the model responses and the recorded data, pressure derivatives can be calculated from both the recorded data and the model responses. The pressure derivatives can be presented on a log-log plot for comparison, for example, in a user interface (UI) provided to practitioners. If the comparison on the log-log plot shows a mismatch, then the properties in the numerical model may need to be re-calibrated, which can be initiated by the practitioners using the UI. Then the simulation can be re-run on the calibrated numerical model, and comparison of the pressure derivatives can be presented again in the log-log plot. If derivative matches are acceptable (for example, to the practitioner), then final results can be obtained. Otherwise, the numerical model can be re-adjusted with respect to the reservoir properties, and the process can be repeated until an acceptable match is achieved. After an acceptable match on the log-log plot is achieved, final results of the analysis can be deemed ready for utilization. Terms and concepts that are associated with elements of reservoir and well data and processes for building numerical models are now presented.

Geological and geophysical data can be collected from field seismic surveys. Collected seismic field data can be input into workflows, where the data can be analyzed and interpreted to derive geological structures, rock typing, and reservoir features (including fractures, faults, and unconformity) of the reservoir. Since the seismic data may have the capability of capturing only large features in the field or the reservoir, some localized geological features may be missed. Based on the shape of the reservoirs, for example, structural maps can be generated by using depth scales (or contour maps). Contour maps can be used with seismic interpretation to determine rock typing. Reservoir structures that are interpreted from seismic data can be incorporated in numerical models. For example, if structural contour maps are available from seismic data, the structural contour maps can be incorporated into the numerical model to indicate oil and gas locations at different depths.

Regarding petrophysics, reservoir properties (including permeability, porosity, saturations, and pay thickness) that originate from petrophysical log data can be used to build numerical models. Petrophysical logs can be run during a drilling phase of a well to collect petrophysical data. For example, logging tools can be run in-hole, and wellbore, rock, and fluid information can be collected. The information can be processed and analyzed to estimate detailed reservoir properties, such as permeability, porosity, saturations, and thickness. Petrophysical logs can provide the resolution necessary to detect and account for localized features in the well or in the vicinity of the well. Logs can serve as the primary and most reliable data sources providing a detailed description of the rock, fluid, and well. The information can be input into numerical models. In situations in which subject wells do not have petrophysical information, modelers can turn to offset wells for petrophysical data used to build numerical models.

Core data samples that are taken out of actual reservoir formations under in-situ conditions during drilling phase of the well can provide valuable data on reservoirs and fluids. Core data may sometimes only be collected in a few wells, depending upon objectives associated with the wells. The samples can be transferred to a laboratory for detailed analyses. When available, core data can be used to determine more reliable reservoir fluid properties than the petrophysical log data. In some cases, because core data is often considered more reliable than log data, core data can be utilized to adjust or calibrate the log data. In case core data is not available, then techniques can rely on petrophysical log data. If core data in offset wells is available, then the core data can also be utilized for enhancing reservoir description.

Pressure, volume, and temperature (PVT) data can be associated with reservoir fluid properties. PVT analysis can include, for example, the process of determining fluid behaviors and properties of oil, water, and gas samples from a reference well. Fluid samples for PVT analyses can be collected from a well during drilling or a production phase of the well. The PVT data can also help to define the phase behavior of reservoir fluids. Formation volume factors, viscosity, gas gravity, gas oil ratio, and water salinity data can serve as inputs into the reservoir model. The inputs can be based on the number of (for example, two or three) phases in the reservoir.

Reservoir initial conditions can refer to the conditions when a well is drilled or before the well is subjected to any production or injection. The pressure and temperature data collected at that time can be referred to as the initial pressure and temperature of the reservoir. These initial conditions can be utilized to build a hydrodynamically-balanced version of the numerical model right before the production or injection occurs.

Fluids contacts information can be collected and used there is more than one type of fluid in a reservoir. Fluids phases, such as gas-to-oil and oil-to-water, can change with respect to depth in reservoirs with multiple fluids. The depth at which a fluid type changes is called a fluid-contact depth. In other words, fluid contacts can define the depths of interfaces between two adjacent phases (for example, gas-oil, oil-water, or gas-water interfaces) in the reservoir. The depths can be used as reference points for pressure calculations in numerical models.

A reference point is the depth at which some or all gauges are set to measure pressure data. A pressure measurement at the reference point (for example, as defined by a gauge depth of the pressure) can be required to initialize and simulate the pressure transient data in numerical models.

A capillary-pressure function can be used to determine the viability of a reservoir that depends upon three critical parameters. One example parameter of the capillary-pressure function is the porosity of the reservoir rock, defining the pore space available for reservoir fluids including hydrocarbons. A second example parameter is the permeability, which defines the ease (or lack of difficulty) of extracting any hydrocarbons in place. A third example parameter is the hydrocarbon saturation, which defines how much of the pore space is occupied by hydrocarbons. The hydrocarbon saturation and the related gas and water saturations are controlled by capillary pressure. Capillary pressure ($p_c$) can be used to define the transition zone in a two- or three-phase system. Capillary pressure data can originate from either petrophysical logs or laboratory analyses. A saturation function can dictate how saturation should change at a particular location of the reservoir.

Relative permeability is a concept that can be used to enforce a preferential level flow capacity due to the presence of multiple fluids at a given location in the reservoir. The relative permeability can depend on pore geometry, wettability, fluid distribution, and fluid saturation history. Relative permeability measurements can be conducted on core samples in a laboratory, which can be both time-consuming and expensive to produce.

In a single-phase system, such as a dry gas or an undersaturated oil reservoir, the effective permeability of flow of the mobile fluid through the reservoir may not vary during production, because the fluid saturations do not change significantly. However, when more than one phase is mobile, the effective permeability to each mobile phase can change as the saturations of the fluids change in the reservoir. In multiphase flow through porous media, the relative permeability of a phase is a dimensionless measure of the effective permeability of that phase. For example, the relative permeability can be the ratio of the effective permeability of that phase to the absolute permeability. Relative permeability can be required for the calculation of permeability in each phase.

Well trajectory refers to the well path along which the well has been drilled. In previous conventional systems, wells were drilled vertically into the ground, and the well trajectory was essentially a straight, vertical line. In current operations, wells can be drilled so that the well trajectory is horizontal or curved. A numerical model can be used to capture the actual well trajectory.

Well completion can refer to the process of making a well hydraulically connected to the intersecting reservoir for production (or injection). Well completion can principally involve preparing the bottom of the hole to the required specifications, running in the production tubing. Well completion can be associated with downhole tools as well as perforating and stimulating as required. The type of perforation can be based on type of completion, such as open-hole or cased-hole completion.

Well control, pressure-transient data, and production rates can be used. Well control parameters that are used in executing numerical modeling can help to define well data in the well. For well control parameters, well history with reference to transient time can be defined. Production history can also be defined separately in different phases (for example, oil, water, or gas), where the separate values can be required to match the transient data. Flow periods and build up or fall-off periods of the wells can be defined. Transient data of the measured pressures and production rates can be input into the numerical model so that the pressure and production rates can be matched with the corresponding model predictions during the simulation phase. The transient data can also help accommodate constraints (for example, well production rates and pressures) to prevent the well production rates and pressures from going below or exceeding certain limits during production or the shut-in phase. The use of constraints can be optional.

FIG. 1 is a flow diagram of a workflow 100 for using numerical models of short-time well test data to characterize low-permeability reservoirs, according to some implementations of the present disclosure. For example, the techniques can be used for tight oil reservoirs, delineation wells, and short transient-pressure data for build-up or fall-off tests.

Figure 2:
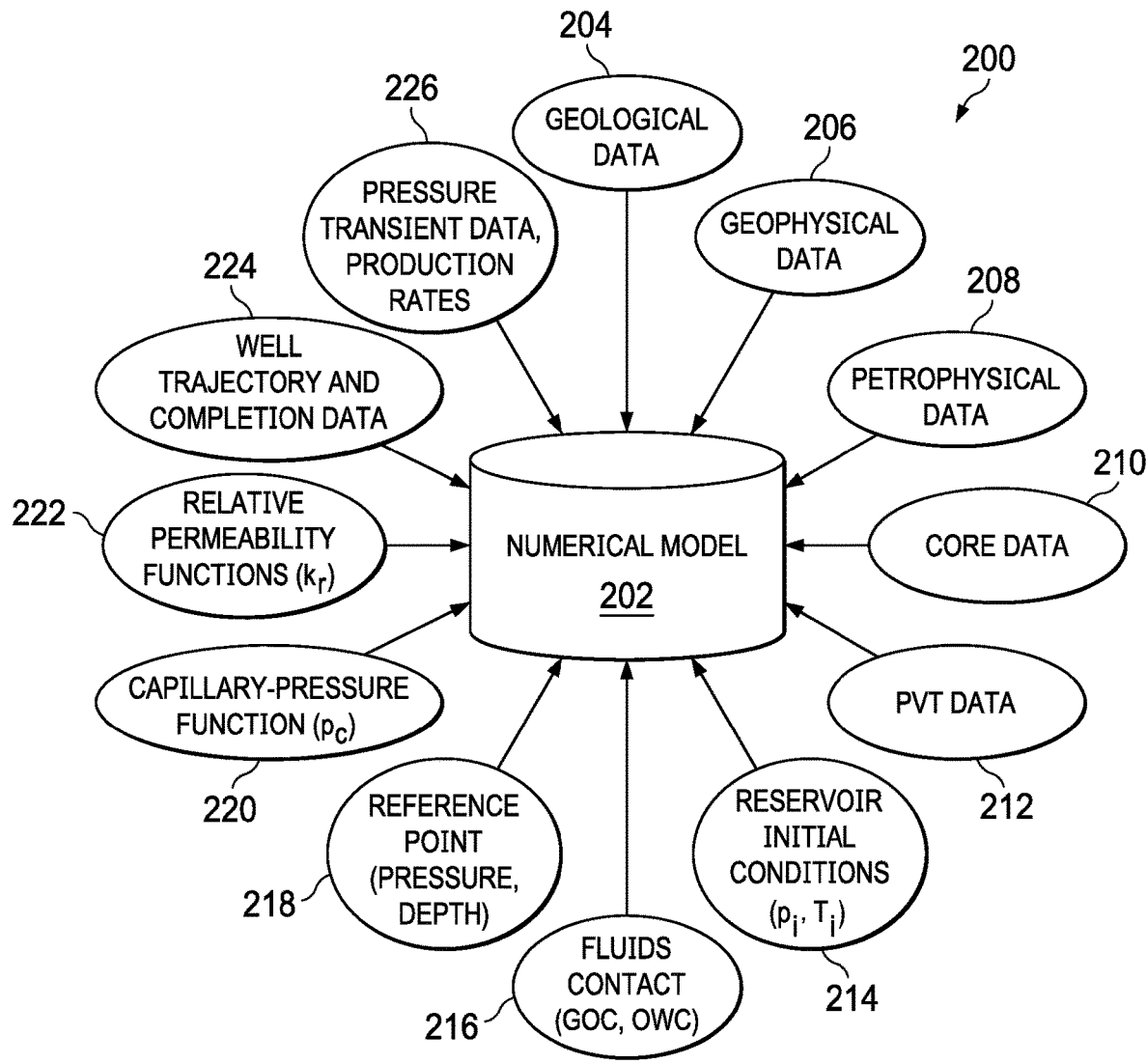
FIG. 2 is a block diagram showing examples of inputs to numerical model preparation of a numerical model, according to some implementations of the present disclosure.

FIG. 2 is a block diagram showing examples of inputs to numerical model preparation 200 of a numerical model 202, according to some implementations of the present disclosure. The numerical model 202 can be used in the workflow 100, for example. The numerical model 202 can be generated from several inputs. For example, the inputs can include geological data 204, geophysical data 206, petrophysical data 208, core data 210, PVT data 212, reservoir initial conditions data 214 (for example, including pressure ($p_i$) and temperature ($T_i$) for each layer i), fluids contacts data 216 (for example, including one or both of gas-oil contact (GOC) and oil-water contact (OWC) data), reference point data 218, capillary pressure ($p_c$) function data 220, relative permeability ($k_r$) data 222, well trajectory and completion data 224, and well control data, transient test data, and productions rates data 226.

Referring again to FIG. 1, at 102, a numerical model is prepared. For example, reservoir and well data 101 can be used to build the numerical model the numerical model 202. Numerical models can be made more reliable and efficient by incorporating reservoir and well data from offset wells. In the event that no offset wells are available, subject well data can provide enough information to build a numerical model. Later on, transient responses can be used to characterize the reservoir away from wellbore. Data used to build numerical models can primarily originate at the well level. The reservoir and well data 101 can include, but is not limited to, geology data 101a, geophysics data 101b, petrophysics data 101c, core data 101d, PVT data 101e, reservoir initial conditions data 101f, fluids contacts data 101g, reference point data 101h, saturations functions data 101i, relative permeability functions data 101j, well trajectory and completion data 101k, and well control data, transient test data, and productions rates data 101l.

At 104, after building the numerical model, quality assurance/quality control (QA/QC) of the model can be performed with reference to input well and reservoir properties as previously discussed. During the QA/QC operations, practitioners can check if all the input well data and reservoir data is incorporated correctly and if the interpolation correlations are working as expected. Practitioners can also check if all the geological features (for example, barriers, faults, fractures, and tight layers) that are derived from seismic and geology data analysis are incorporated correctly. Practitioners can also decide if reservoir properties from the petrophysical log data (optionally corrected, based on available core data), PVT data based on the collected samples and well data according to well completion and production data are in agreement with input well and reservoir properties, and are defined correctly. Reservoir properties can include, for example, permeability, porosity, fluids saturation, saturation functions, relative permeability, fluids contacts, and reservoir initial conditions. Well data can include, for example, perforations, geometry, and production rates.

In some implementations, performing QA/QC of the model can include analyzing the input data from each well. A goal of the analysis is to show an agreement between input well and reservoir data at the respective well location. Deriving properties between two wells can be completed using interpolation techniques that are consistent with the model and the general understanding of the field.

At 106, a determination is made whether the numerical model is acceptable after performing QA/QC. If the numerical model is acceptable after performing QA/QC, and all the well and reservoir data in the numerical model is determined to be in agreement with input, processing can proceed to step 110.

Otherwise, at step 108, properties are adjusted to correct or refine well and reservoir properties. The adjustments can prevent errors from corrupting the final product, including errors that may lead to misleading results and interpretation. For example, for the numerical model, the input of correct field and reservoir data is key to providing quick and reliable results. Step 108 can be used in the event that the numerical model shows some inconsistency with reference to input well and reservoir data. For example, in the numerical model, the reservoir and well data in model can be adjusted according to actual input parameters to create a corrected numerical model.

After adjusting the well and reservoir properties in the numerical model at 108, step 104 can be repeated, and the QA/QC step can be performed again on the numerical model. When performing QA/QC on the model with reference to input well and reservoir properties, a check can be made that all input well and reservoir data are incorporated correctly, and that the interpolation correlations are working reasonably. A check can also be made that all the geological features (for example, barrier, fault, fractures, and tight layers) that are derived from seismic and geology data analysis are incorporated correctly. The check can also include determining that reservoir properties from the petrophysical log data, PVT data based on the collected samples, and well data according to well completion and production data are in agreement with input well and reservoir properties and are defined correctly. Performing the QA/QC on the model can include making sure that the data from each well shows the similar behavior and is in agreement with input well and reservoir data at respective well locations. Properties between two wells can be derived utilizing a suitable interpolation method, consistent with the model and the general understanding of the field. If model is acceptable, then step 110 can occur. Otherwise steps 104-108 can be repeated to keep adjusting and correcting the numerical model until the numerical model is acceptable.

At 110, once an acceptable numerical model is built, the recorded pressure-transient data can be deemed ready for use, and pressure derivatives can be extracted from the transient data. For example, pressure derivatives can be calculated from the recorded pressure-transient data and historical production rates. The calculated pressure difference and pressure derivative can be utilized in the matching process. Extracted pressure derivative can be displayed in the log-log plot for QA/QC purposes for an analyst to check that all the transient and production rates changes are synchronized and addressed in a consistent manner (because pressure derivative is defined by production behavior). Any changes in production rates can have a major impact on pressure derivatives. As a result, QA/QC of pressure derivative is very important before moving to the next step.

At 112, a functional numerical model is created. For example, the pressure derivative is extracted and incorporated into the numerical model, which can help to prepare the final functional numerical model to be used to run simulations for reservoir characterization. A simulation of the functional numerical model can be directly run by using recorded (or measured) transient data without the need to define the flow capacity. In conventional transient analysis method, the flow capacity of the transient data can be required to be defined in advance. Without defining the flow capacity a priori, simulation as part of interpretation cannot proceed. In exploration wells, or in tight oil reservoirs or gas reservoirs, where only short-time build-up or fall-off data is available, late radial flow regime cannot be achieved. Further, the a priori estimation of flow capacity is not easy in the absence of any supporting data. By using the techniques of the present disclosure, simulations can be run directly with the transient data to characterize the reservoir without identifying the infinite-acting radial flow regime.

At 114, a simulation is run on functional numerical model to generate simulated pressure responses from the model. A simulation time period can be defined based on recorded transient pressure data.

At 116, simulation pressure responses from the functional numerical model are compared with the actual, recorded transient-pressure data.

At 118, a determination is made as to whether the pressure match is acceptable. For example, a comparison is performed and a determination is made whether simulated pressure responses of the functional numerical model match with recorded pressure transient data. Such a comparison can help to understand how the reservoir model needs to be changed, if required, to achieve an acceptable match between the simulated pressure responses from the numerical model and the recorded pressure transient data. Thus, the functional numerical model may need modification in reservoir properties and features if the pressure match is not acceptable.

At 120 (if the comparison at 118 is not acceptable), the well and reservoir properties are adjusted, and the process returns to step 112. The simulated pressure responses are reviewed in comparison to the recorded transient pressure responses. Simulated pressure responses may suggest that the functional numerical model requires adjustments in reservoir properties (for example, k, $k_z$, skin, completion), well data (for example, well length or perforations), and reservoir features (for example, faults, barrier, fractures, and baffles), according to the simulated pressure responses. Among these properties, k is horizontal permeability, and $k_z$ is vertical permeability. The functional numerical model can be kept running using the adjusted properties (steps 114-118) until an acceptable match between simulated pressure responses from the functional numerical model and the recorded pressure transient data is achieved.

At 122, after achieving the acceptable match between model pressures and measured pressures at 118, the derivatives from both simulated pressure and recorded transient pressure data for comparison are computed on the log-log plot. The plot can be provided for display to an analyst, for example.

At 124, the pressure derivative values on the log-log plot constructed are compared with both simulated pressure responses and the recorded pressure values. For example, the derivatives of the simulated pressure responses are reviewed in comparison to those of measured pressure values on a log-log plot. If the pressure derivative matches on the log-log plot are acceptable, then step 126 can occur. If the pressure derivative match is not acceptable, then processing can return to step 120. Such a comparison of simulated and recorded pressure derivatives may present a mismatch between the simulated and the recorded pressures. The existence of a mismatch can suggest that the functional numerical model requires further adjustments of at least one of the properties, such as reservoir, well data, or geological features adopted in the numerical model. Such a cycle of adjusting the reservoir features and properties can continue until an acceptable match on the log-log plot is achieved. Although multiple properties may require adjustments in the functional numerical model to deal with the observed mismatch on the log-log plot, experience can show that it is productive to change one property at a time to appreciate the impacts of such changes or adjustments on the pressure derivative and the pressure difference profiles on the log-log plot. After achieving acceptable match between both sets of pressures derivatives, the next step can occur.

At 126, after the pressure derivative matches on the log-log plot are acceptable at 124, final results of the acceptable match are output. One of the main output results of this numerical model is the flow capacity (kh), (for example, in md-ft), which can be calculated from the permeability (k) values in the model.

An example follows regarding adjusting the effective length of a horizontal well in the numerical model. After looking at the pressure derivative of a simulated response for a given horizontal well length, a change can first be made to the effective well length, and its effects on the log-log plot can be observed. Additional changes can be made to the well length, up to the well's physical limit of the actual drilled length, until the simulated responses and the actual pressures converge (cannot get any closer, in other words). Then, another parameter (for example, vertical permeability, skin, or distance to a fault) is selected, again one at a time, and adjusted. Simulations can be run to get as close to the measured pressures as possible on the log-log plot. This process can be repeated for each parameter, individually. It can be recommended that the adjustment of permeability is to be considered as a last resort, because the original input of permeability from the static data already exists (through logs and core), and property can be honored as much as possible. The permeability may be considered for modification, for example, only after the derivative match is not be obtained by adjusting the other parameters.

After an acceptable match between the pressure derivatives of responses of the functional numerical model and those of the recorded transient pressures on log-log plot is achieved, final objective of the entire methodology is achieved. Hence, the properties of the functional model in its final form can be deemed accepted as the representative of the actual reservoir, and the final properties can be regarded as reservoir characterization.

Figure 3:
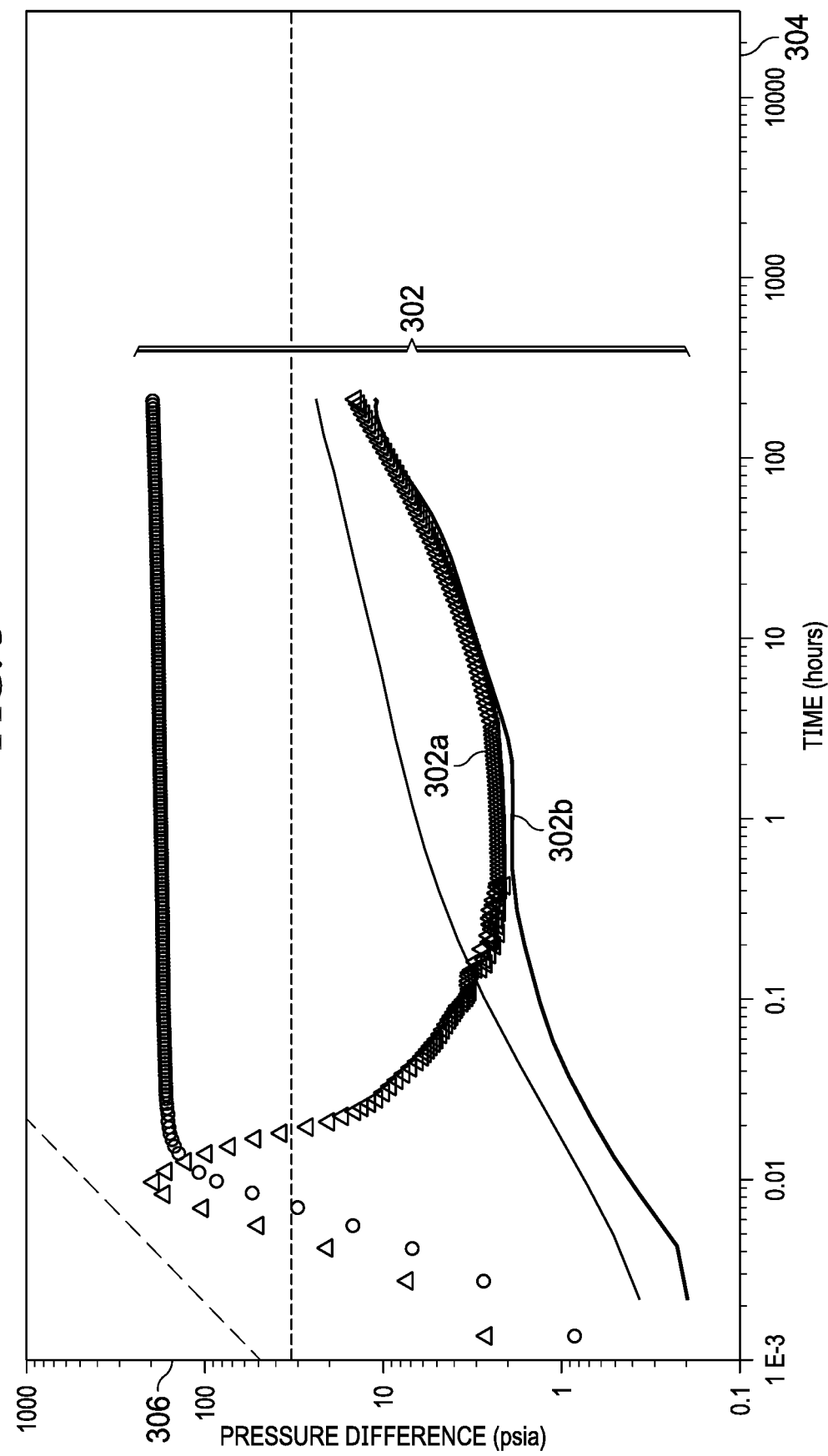
FIG. 3 is a log-log plot showing an example of a mismatch between derivatives of simulated and recorded pressures, according to some implementations of the present disclosure.

FIG. 3 is a log-log plot 300 showing an example of a mismatch between derivatives of simulated and recorded pressures, according to some implementations of the present disclosure. For example, the log-log plot 300 can result from adjusting the skin factor of the well. The log-log plot 300 includes derivatives that are plotted relative to a time axis 304 (for example, in hours (hr)) and a pressure difference axis 306 (for example, in pounds per square inch absolute (psia)). In this example, the log-log plot 300 shows that a partial match has been achieved, particularly in lines 302a and 302b. A complete or better match can be achieved, for example, if all the properties and geological features are changed together in the functional numerical model. However, doing this can result in losing the partial match that has been achieved. In some implementations, an optimal approach can be to change properties or features one at a time.

Figure 4:
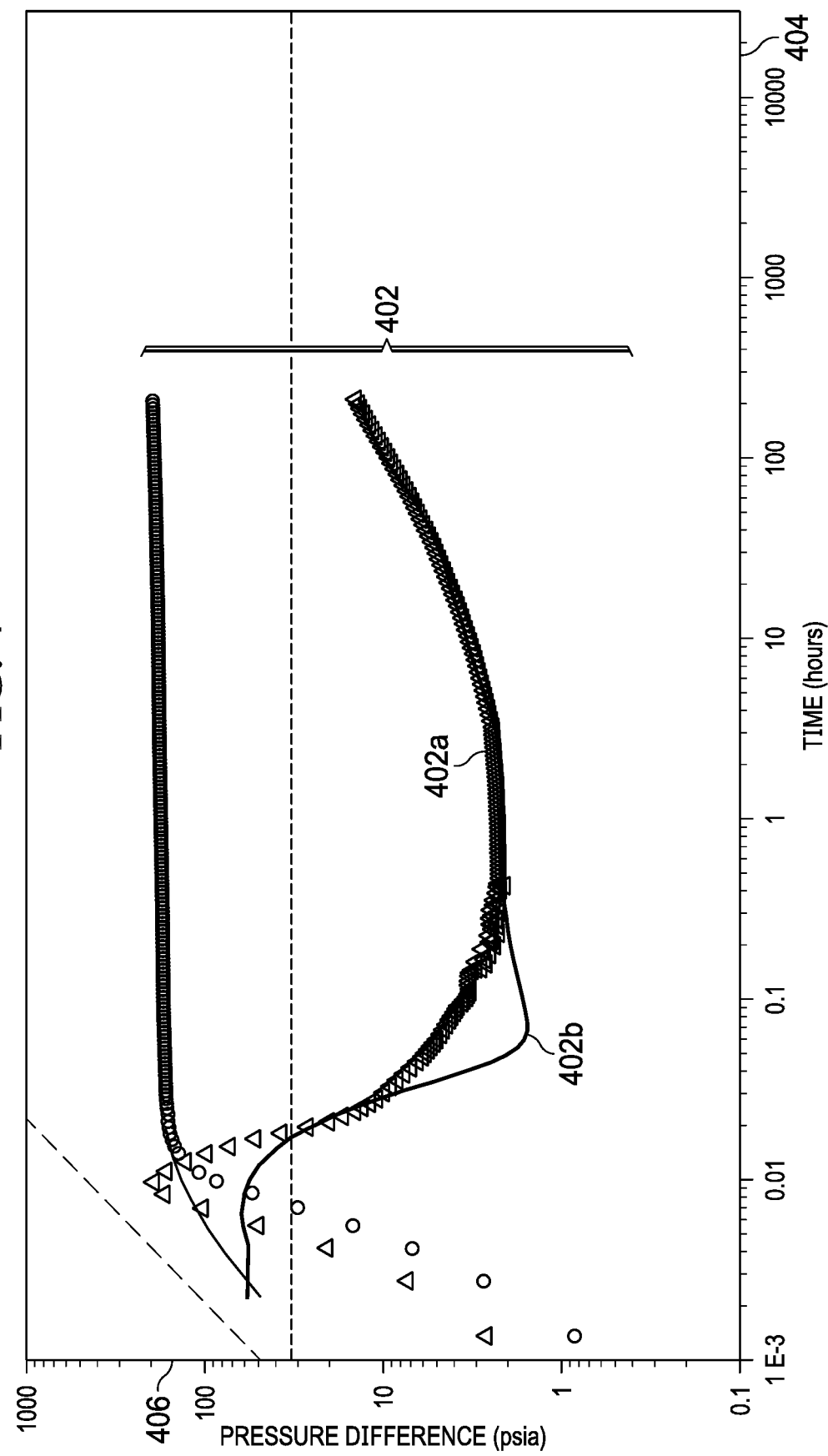
FIG. 4 is a log-log plot showing an example of an acceptable match between derivatives of simulated and actual recorded pressure, according to some implementations of the present disclosure.

FIG. 4 is a log-log plot showing an example of an acceptable match between derivatives of simulated and actual recorded pressure, according to some implementations of the present disclosure. For example, the results can be achieved by changing the skin value from 0 to +0.6. The log-log plot 400 includes derivatives that are plotted relative to a time axis 404 (for example, in hours (hr)) and a pressure difference axis 406 (for example, in psia). FIG. 4 shows that, by changing only one property (for example, skin factor), an acceptable pressure derivative match between simulated pressure and actual pressure can be achieved. In this example, the log-log plot 400 shows that a partial match has been achieved, particularly in lines 402a and 402b. In this example, the skin value has been changed from 0 to +0.6 in the functional numerical for the acceptable match. As previously described, permeability can be adjusted at any stage if derivative responses clearly suggest that derivative match cannot be achieved without changing permeability.

The process described with respect to FIG. 1 was applied to more than six transient tests of tight reservoirs, where transient data was not captured long enough to reach late radial (infinite-acting) flow regime. Although no offset wells were available to verify the flow capacity of the reservoirs prior to applying the new methodology, acceptable results of these cases were achieved.

Figure 5:
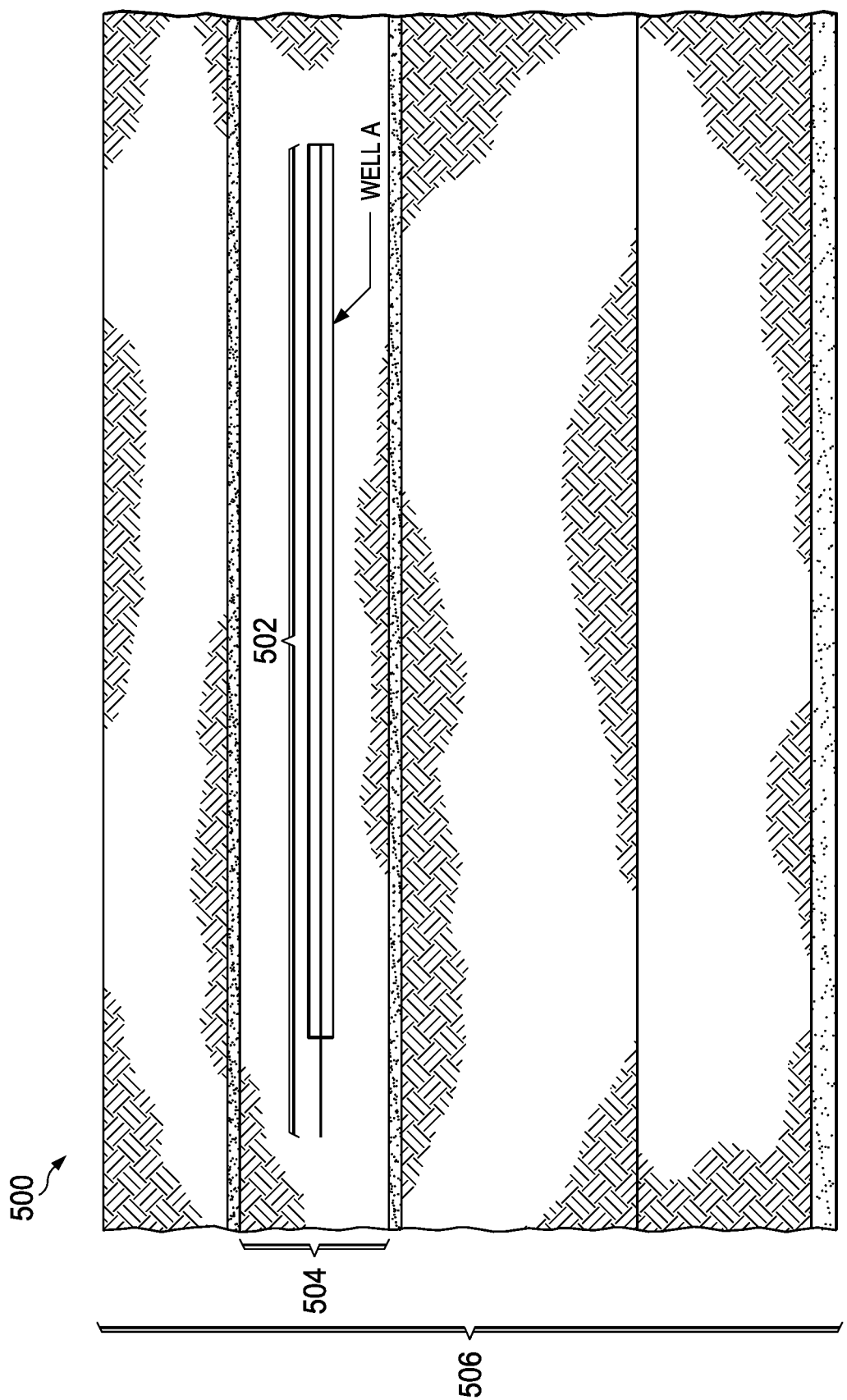
FIG. 5 is an example plot of a prepared multi-layer numerical model for Well A, according to some implementations of the present disclosure.

FIG. 5 is an example plot of a prepared multi-layer numerical model 500 for Well A, according to some implementations of the present disclosure. The multi-layer numerical model 500 can be created, for example, using the workflow 100. For example, the multi-layer numerical model 500 includes a multilayer (seven-layer) numerical model that is built based on the available data to characterize the reservoir using the fall-off transient data of the horizontal well.

As illustrated in FIG. 5, a horizontal well 502 was completed in a third layer 504 in a seven-layer reservoir model with seven layers 506. The well 502 was shut-in for 270 hours to collect fall-off transient data. However, due to tightness of the reservoir, the test time was not long enough to reach the late radial flow regime during the shut-in time. In general, subject tests typically require a longer shut-in time to achieve the late radial flow regime. As such, under these types of circumstances, a priori knowledge of the flow capacity is difficult to know.

Figure 6:
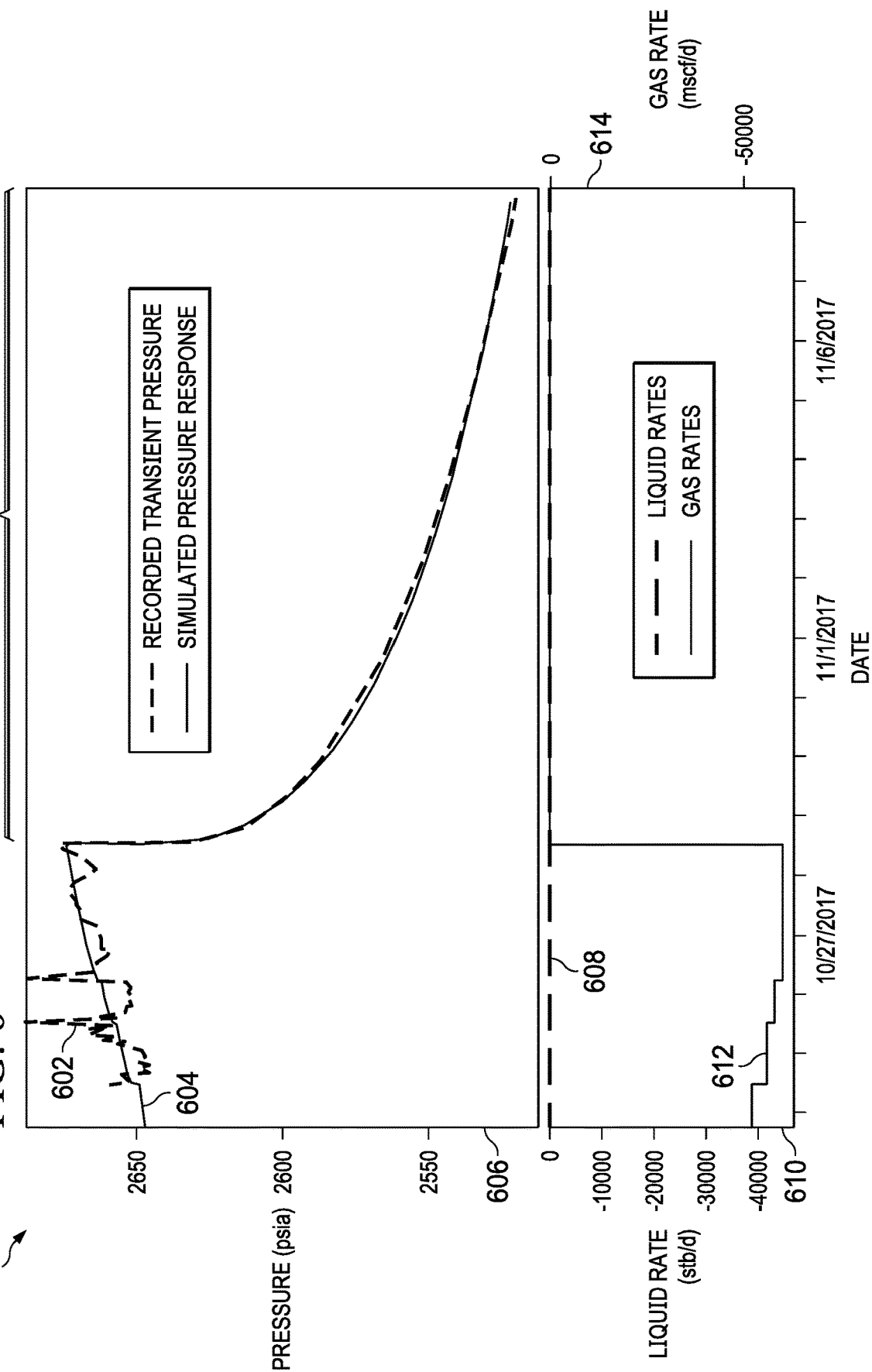
FIG. 6 is a graph showing examples of a Cartesian plot of recorded test data and matched simulation pressure for Well A, according to some implementations of the present disclosure.

FIG. 6 is a graph showing examples of a Cartesian plot 600 of recorded test data 602 and matched simulation pressure 604 for Well A, according to some implementations of the present disclosure. When combined, the recorded test data 602 and the matched simulation pressure 604 can characterize the reservoir. The recorded test data 602 and the matched simulation pressure 604 are plotted relative to a pressure axis 606 (for example, in pounds per square inch absolute (psia)). Liquid rates 608 are plotted relative to a liquid rate axis 610 (for example, in stock tank barrels per day (stb/d)). Gas rates 612 are plotted relative to a gas rate axis 614 (for example, in thousands of standard cubic feet per day (mscf/d)). A simulation has been run on the functional numerical model, consisting of reservoir layers, to match the recorded fall-off pressure data. A pressure derivative was extracted from the both simulated pressure and recorded fall-off pressure to compare in the log-log plot. The Cartesian plot 600 shows a convergence 616 of the recorded test data 602 and the matched simulation pressure 604.

Figure 7:
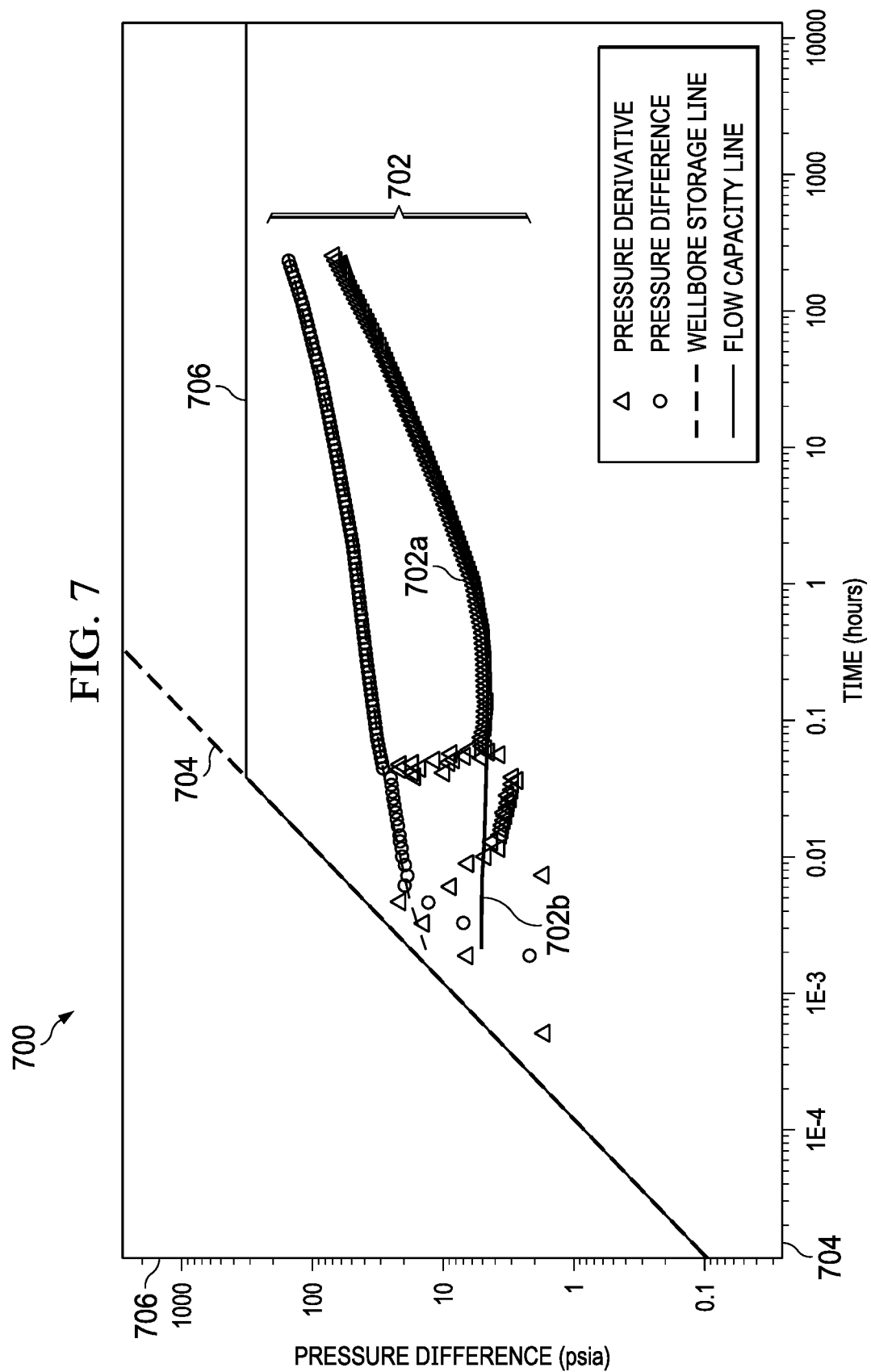
FIG. 7 is a log-log plot showing an example of recorded and matched data for Well A, according to some implementations of the present disclosure.

FIG. 7 is a log-log plot 700 showing an example of recorded and matched data for Well A, according to some implementations of the present disclosure. For example, the pressure derivative of the recorded fall-off pressure data is matched in a log-log plot as shown in FIG. 7. In this example, the log-log plot 700 shows that a partial match has been achieved, particularly in lines 702a and 702b. Thus, the plot in FIG. 7 shows a successful match between the pressure derivative of the recorded transient fall-off pressure data and the simulation pressure response. The log-log plot 700 shows a wellbore storage line 704 and a flow capacity line 706.

Table 1 identifies per-layer properties which are then used to illustrate how the per-layer properties can be utilized to calculate the flow capacity of the total system.

TABLE 1

| Computation of flow capacity from layer properties | | |
|---|---|---|
| Layer Number, i | Thickness, $h_i$, ft | Permeability, $k_i$, md |
| 1 | 80 | 20 |
| 2 | 5 | 0.1 |
| 3 | 85 | 7 |
| 4 | 5 | 0.1 |
| 5 | 145 | 20 |
| 6 | 110 | 2 |
| 7 | 20 | 2 |

Total flow capacity can be calculated, for example, using Equation (1):

$$\text{Total Flow Capacity} = \sum_{i=1}^{7} k_i h_i \quad (1)$$

where $k_i$ is the permeability, for example, in millidarcies (md) of the ith layer, and $h_i$ is the pay thickness, for example, in feet (ft) of the ith layer. Using the values in Table 1, for example, the total flow capacity can be calculated as 5,355 md-ft.

The example of a successful match of the pressure derivative in shown FIG. 7. The calculation of flow capacity from the final permeability distribution as shown Table 1 confirms the completeness of the process. FIGS. 8A-9B show supplementary examples of Wells B and C using a successful implementation of the process of successfully matching the recorded transient pressure data and pressure derivative using the previously described methodology. Both Wells B and C were extracted from tight reservoirs where shut-in wells did not reach the late radial flow regime, even after shutting in the wells for more than 200 hours. In these cases, conventional pressure-transient analysis could not be utilized to characterize the reservoirs because enough data could not be gathered due to the shorter-than-required tests.

FIG. 8A is a graph showing examples of a Cartesian plot 800 of recorded test data 802 and matched simulation pressure 804 for Well B, according to some implementations of the present disclosure. The recorded test data 802 and the matched simulation pressure 804 are plotted relative to a pressure axis 806 (for example, in psia). Liquid rates 808 are plotted relative to a liquid rate axis 810 (for example, in stb/d). Gas rates 812 are plotted relative to a gas rate axis 814 (for example, in mscf/d). The Cartesian plot 800 shows a convergence 816 of the recorded test data 802 and the matched simulation pressure 804. The convergence 816 occurs over time 818 (for example, in hours).

Figure 8B:
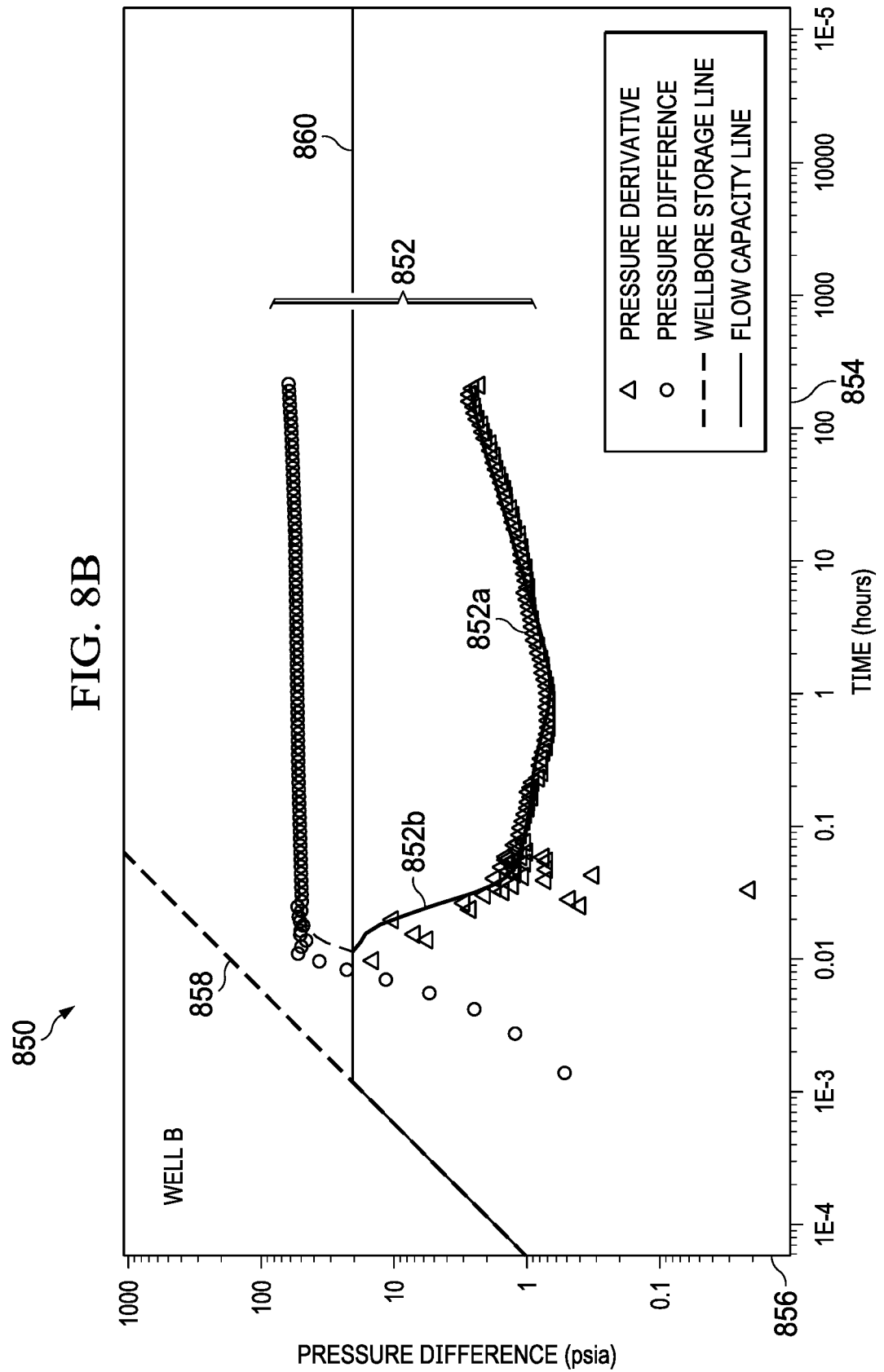
FIG. 8B is a log-log plot showing an example of recorded and matched data for Well B, according to some implementations of the present disclosure.

FIG. 8B is a log-log plot 850 showing an example of recorded and matched data for Well B, according to some implementations of the present disclosure. For example, the pressure derivative of the recorded fall-off pressure data is matched in a log-log plot as shown in FIG. 8B. In this example, the log-log plot 850 shows that a partial match has been achieved, particularly in lines 852a and 852b. Thus the plot in FIG. 8B shows a successful match between the pressure derivative of the recorded transient fall-off pressure data and the simulation pressure response. The log-log plot 850 shows a wellbore storage line 858 and a flow capacity line 860.

FIG. 9A is a graph showing examples of a Cartesian plot 900 of recorded test data 902 and matched simulation pressure 904 for Well C, according to some implementations of the present disclosure. The recorded test data 902 and the matched simulation pressure 904 are plotted relative to a pressure axis 906 (for example, in psia). Liquid rates 908 are plotted relative to a liquid rate axis 910 (for example, in stb/d). Gas rates 912 are plotted relative to a gas rate axis 914 (for example, in mscf/d). The Cartesian plot 900 shows a convergence 916 of the recorded test data 902 and the matched simulation pressure 904. The convergence 916 occurs over time 918 (for example, in hours).

Figure 9B:
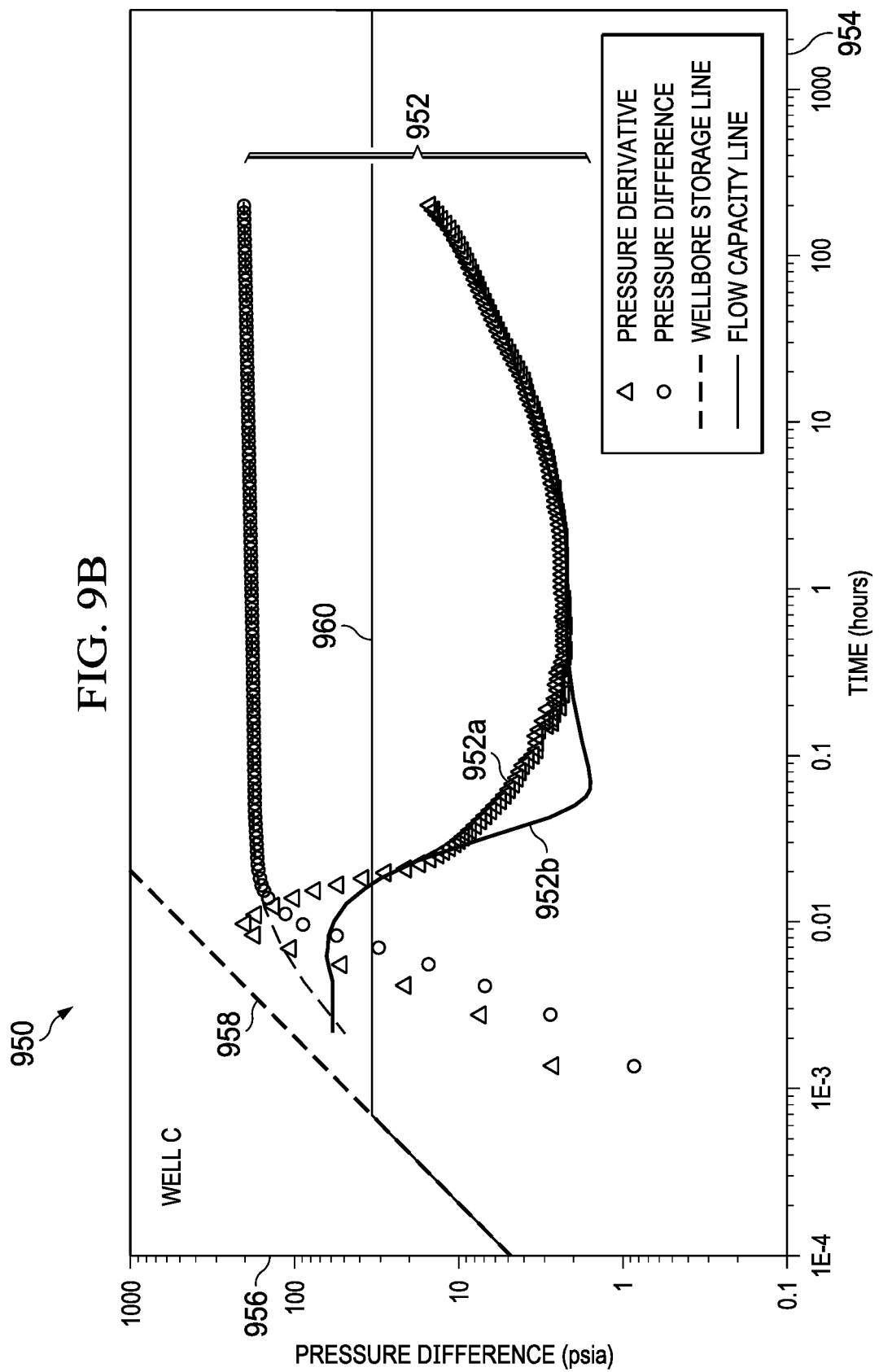
FIG. 9B is a log-log plot showing an example of recorded and matched data for Well C, according to some implementations of the present disclosure.

FIG. 9B is a log-log plot 950 showing an example of recorded and matched data for Well C, according to some implementations of the present disclosure. For example, the pressure derivative of the recorded fall-off pressure data is matched in the log-log plot as shown in FIG. 9B. In this example, the log-log plot 950 shows that a partial match has been achieved, particularly in lines 952a and 952b. Thus the plot in FIG. 9B shows a successful match between the pressure derivative of the recorded transient fall-off pressure data and the simulation pressure response. The log-log plot 950 shows a wellbore storage line 958 and a flow capacity line 960.

Figure 10:
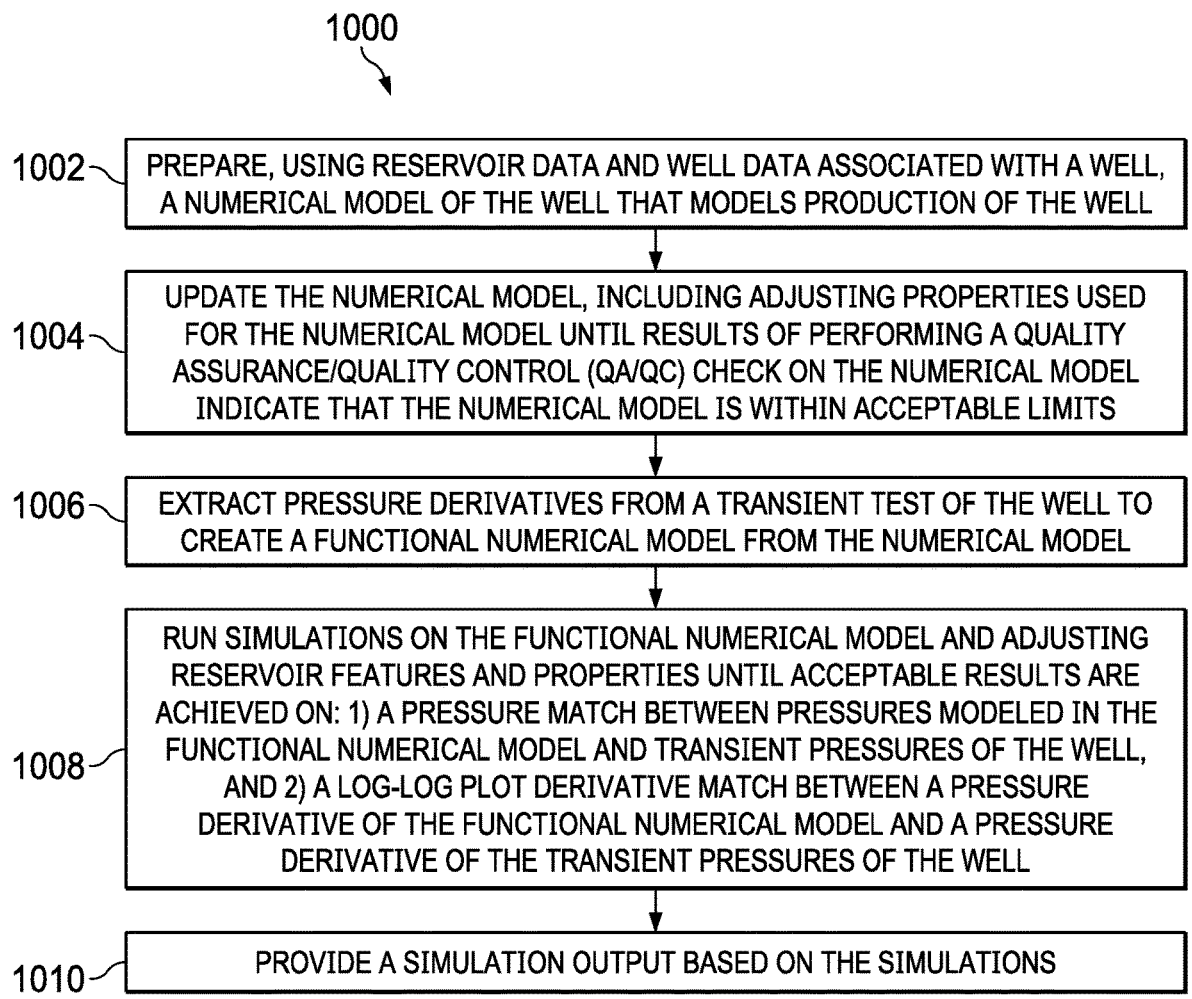
FIG. 10 is a flowchart of an example of a method for running simulations on a functional numerical model and providing output, according to some implementations of the present disclosure.

FIG. 10 is a flowchart of an example of a method 1000 for running simulations on a functional numerical model and providing output, according to some implementations of the present disclosure. For clarity of presentation, the description that follows generally describes method 1000 in the context of the other figures in this description. However, it will be understood that method 1000 can be performed, for example, by any suitable system, environment, software, and hardware, or a combination of systems, environments, software, and hardware, as appropriate. In some implementations, various steps of method 1000 can be run in parallel, in combination, in loops, or in any order.

At 1002, a numerical model of a well that models production of the well is prepared using reservoir data and well data associated with the well. For example, preparing the numerical model can include building the numerical model using geological data, geophysical data, petrophysical data, core data, PVT data, reservoir initial conditions data including pressure ($p_i$) and temperature ($T_i$) for each layer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data. From 1002, method 1000 proceeds to 1004.

At 1004, the numerical model is updated, including adjusting properties used for the numerical model, until results of performing a quality assurance/quality control (QA/QC) check on the numerical model indicate that the numerical model is within acceptable limits. For example, updating the numerical model can include the following. A quality assurance/quality control (QA/QC) check can be performed on the numerical model. A determination can be made whether the numerical model is within acceptable limits. Upon determining that the numerical model is not within acceptable limits, properties used in the numerical model can be adjusted. The QA/QC check, the determining, and the adjusting can be repeated until the numerical model is within acceptable limits.

In some implementations, performing the QA/QC check on the numerical model can include an analysis of geological features and reservoir properties. For example, a determination can be made that geological features (including barriers, faults, fractures, and tight layers derived from seismic and geology data analysis of the well) are incorporated correctly in the numerical model. Also, a determination can be made that reservoir properties from petrophysical log data, pressure/volume/temperature (PVT) data based on collected samples, and well data corresponding to well completion and production data of the well are in agreement with input well and reservoir properties. Reservoir properties can include, for example, permeability, porosity, fluids saturation, saturation functions, relative permeability, fluids contacts, and reservoir initial conditions of the well. Well data can include, for example, perforations, geometry, and production rates of the well. From 1004, method 1000 proceeds to 1006.

At 1006, pressure derivatives are extracted from a transient test of the well to create a functional numerical model from the numerical model. For example, pressure derivatives such as described with reference to FIGS. 6-9B can be determined. From 1006, method 1000 proceeds to 1008.

At 1008, simulations are run on the functional numerical model and reservoir features and properties are adjusted until acceptable results are achieved on: 1) a pressure match between pressures modeled in the functional numerical model and transient pressures of the well, and 2) a log-log plot derivative match between a pressure derivative of the functional numerical model and a pressure derivative of the transient pressures of the well. From 1008, method 1000 proceeds to 1010.

At 1010, a simulation output that is based on the simulations is provided. For example, the simulation output can include a flow capacity (kh) determined from permeability (k) values of the model. In some implementations, providing the simulation output based on the simulations can include providing simulation output information for presentation to a user in a user interface. For example, the information that is presented can include numerical comparisons of the pressures modeled in the functional numerical model and the transient pressures of the well, and graphical representations of log-log plot derivative matches. After 1010, method 1000 can stop.

In some implementations, method 1000 further includes incorporating, into the numerical model, reservoir structures interpreted from seismic data. For example, structural contour maps (if available from seismic data) indicate oil and gas locations at different depths can be incorporated into the numerical model.

Figure 11:
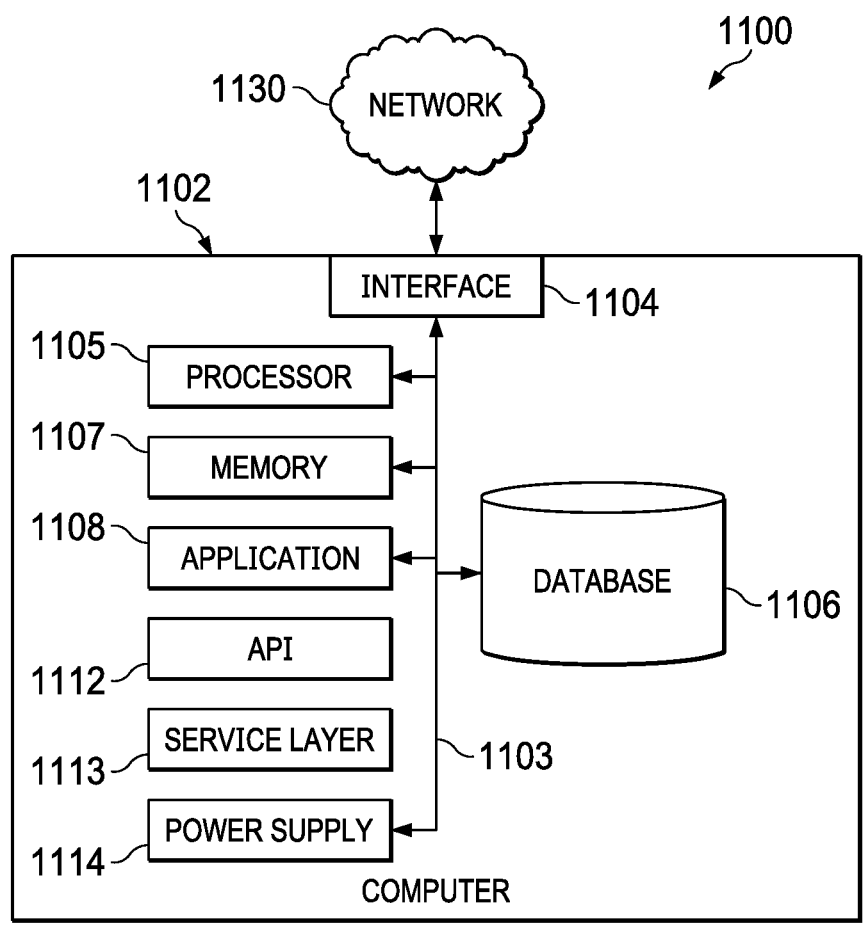
FIG. 11 is a block diagram illustrating an example computer system used to provide computational functionalities associated with described algorithms, methods, functions, processes, flows, and procedures as described in the present disclosure, according to some implementations of the present disclosure.

FIG. 11 is a block diagram of an example computer system 1100 used to provide computational functionalities associated with described algorithms, methods, functions, processes, flows, and procedures described in the present disclosure, according to some implementations of the present disclosure. The illustrated computer 1102 is intended to encompass any computing device such as a server, a desktop computer, a laptop/notebook computer, a wireless data port, a smart phone, a personal data assistant (PDA), a tablet computing device, or one or more processors within these devices, including physical instances, virtual instances, or both. The computer 1102 can include input devices such as keypads, keyboards, and touch screens that can accept user information. Also, the computer 1102 can include output devices that can convey information associated with the operation of the computer 1102. The information can include digital data, visual data, audio information, or a combination of information. The information can be presented in a graphical user interface (UI) (or GUI).

The computer 1102 can serve in a role as a client, a network component, a server, a database, a persistency, or components of a computer system for performing the subject matter described in the present disclosure. The illustrated computer 1102 is communicably coupled with a network 1130. In some implementations, one or more components of the computer 1102 can be configured to operate within different environments, including cloud-computing-based environments, local environments, global environments, and combinations of environments.

At a high level, the computer 1102 is an electronic computing device operable to receive, transmit, process, store, and manage data and information associated with the described subject matter. According to some implementations, the computer 1102 can also include, or be communicably coupled with, an application server, an email server, a web server, a caching server, a streaming data server, or a combination of servers.

The computer 1102 can receive requests over network 1130 from a client application (for example, executing on another computer 1102). The computer 1102 can respond to the received requests by processing the received requests using software applications. Requests can also be sent to the computer 1102 from internal users (for example, from a command console), external (or third) parties, automated applications, entities, individuals, systems, and computers.

Each of the components of the computer 1102 can communicate using a system bus 1103. In some implementations, any or all of the components of the computer 1102, including hardware or software components, can interface with each other or the interface 1104 (or a combination of both), over the system bus 1103. Interfaces can use an application programming interface (API) 1112, a service layer 1113, or a combination of the API 1112 and service layer 1113. The API 1112 can include specifications for routines, data structures, and object classes. The API 1112 can be either computer-language independent or dependent. The API 1112 can refer to a complete interface, a single function, or a set of APIs.

The service layer 1113 can provide software services to the computer 1102 and other components (whether illustrated or not) that are communicably coupled to the computer 1102. The functionality of the computer 1102 can be accessible for all service consumers using this service layer. Software services, such as those provided by the service layer 1113, can provide reusable, defined functionalities through a defined interface. For example, the interface can be software written in JAVA, C++, or a language providing data in extensible markup language (XML) format. While illustrated as an integrated component of the computer 1102, in alternative implementations, the API 1112 or the service layer 1113 can be stand-alone components in relation to other components of the computer 1102 and other components communicably coupled to the computer 1102. Moreover, any or all parts of the API 1112 or the service layer 1113 can be implemented as child or sub-modules of another software module, enterprise application, or hardware module without departing from the scope of the present disclosure.

The computer 1102 includes an interface 1104. Although illustrated as a single interface 1104 in FIG. 11, two or more interfaces 1104 can be used according to particular needs, desires, or particular implementations of the computer 1102 and the described functionality. The interface 1104 can be used by the computer 1102 for communicating with other systems that are connected to the network 1130 (whether illustrated or not) in a distributed environment. Generally, the interface 1104 can include, or be implemented using, logic encoded in software or hardware (or a combination of software and hardware) operable to communicate with the network 1130. More specifically, the interface 1104 can include software supporting one or more communication protocols associated with communications. As such, the network 1130 or the interface's hardware can be operable to communicate physical signals within and outside of the illustrated computer 1102.

The computer 1102 includes a processor 1105. Although illustrated as a single processor 1105 in FIG. 11, two or more processors 1105 can be used according to particular needs, desires, or particular implementations of the computer 1102 and the described functionality. Generally, the processor 1105 can execute instructions and can manipulate data to perform the operations of the computer 1102, including operations using algorithms, methods, functions, processes, flows, and procedures as described in the present disclosure.

The computer 1102 also includes a database 1106 that can hold data for the computer 1102 and other components connected to the network 1130 (whether illustrated or not). For example, database 1106 can be an in-memory, conventional, or a database storing data consistent with the present disclosure. In some implementations, database 1106 can be a combination of two or more different database types (for example, hybrid in-memory and conventional databases) according to particular needs, desires, or particular implementations of the computer 1102 and the described functionality. Although illustrated as a single database 1106 in FIG. 11, two or more databases (of the same, different, or combination of types) can be used according to particular needs, desires, or particular implementations of the computer 1102 and the described functionality. While database 1106 is illustrated as an internal component of the computer 1102, in alternative implementations, database 1106 can be external to the computer 1102.

The computer 1102 also includes a memory 1107 that can hold data for the computer 1102 or a combination of components connected to the network 1130 (whether illustrated or not). Memory 1107 can store any data consistent with the present disclosure. In some implementations, memory 1107 can be a combination of two or more different types of memory (for example, a combination of semiconductor and magnetic storage) according to particular needs, desires, or particular implementations of the computer 1102 and the described functionality. Although illustrated as a single memory 1107 in FIG. 11, two or more memories 1107 (of the same, different, or combination of types) can be used according to particular needs, desires, or particular implementations of the computer 1102 and the described functionality. While memory 1107 is illustrated as an internal component of the computer 1102, in alternative implementations, memory 1107 can be external to the computer 1102.

The application 1108 can be an algorithmic software engine providing functionality according to particular needs, desires, or particular implementations of the computer 1102 and the described functionality. For example, application 1108 can serve as one or more components, modules, or applications. Further, although illustrated as a single application 1108, the application 1108 can be implemented as multiple applications 1108 on the computer 1102. In addition, although illustrated as internal to the computer 1102, in alternative implementations, the application 1108 can be external to the computer 1102.

The computer 1102 can also include a power supply 1114. The power supply 1114 can include a rechargeable or non-rechargeable battery that can be configured to be either user- or non-user-replaceable. In some implementations, the power supply 1114 can include power-conversion and management circuits, including recharging, standby, and power management functionalities. In some implementations, the power-supply 1114 can include a power plug to allow the computer 1102 to be plugged into a wall socket or a power source to, for example, power the computer 1102 or recharge a rechargeable battery.

There can be any number of computers 1102 associated with, or external to, a computer system containing computer 1102, with each computer 1102 communicating over network 1130. Further, the terms "client," "user," and other appropriate terminology can be used interchangeably, as appropriate, without departing from the scope of the present disclosure. Moreover, the present disclosure contemplates that many users can use one computer 1102 and one user can use multiple computers 1102.

Described implementations of the subject matter can include one or more features, alone or in combination.

For example, in a first implementation, a computer-implemented method includes the following. A numerical model modeling production of a well is prepared using reservoir data and well data associated with the well. The numerical model is updated, including adjusting properties used for the numerical model, until results of performing a quality assurance/quality control (QA/QC) check on the numerical model indicate that the numerical model is within acceptable limits. Pressure derivatives are extracted from a transient test of the well to create a functional numerical model from the numerical model. Simulations are run on the functional numerical model and reservoir features and properties are adjusted until acceptable results are achieved on: 1) a pressure match between pressures modeled in the functional numerical model and transient pressures of the well, and 2) a log-log plot derivative match between a pressure derivative of the functional numerical model and a pressure derivative of the transient pressures of the well. A simulation output that is based on the simulations is provided.

The foregoing and other described implementations can each, optionally, include one or more of the following features:

A first feature, combinable with any of the following features, where performing the QA/QC check on the numerical model includes: determining that geological features including barriers, faults, fractures, and tight layers derived from seismic and geology data analysis of the well are incorporated correctly in the numerical model; and determining that reservoir properties from petrophysical log data, pressure/volume/temperature (PVT) data based on collected samples, and well data corresponding to well completion and production data of the well are in agreement with input well and reservoir properties; where reservoir properties include permeability, porosity, fluids saturation, saturation functions, relative permeability, fluids contacts, and reservoir initial conditions of the well; and where well data includes perforations, geometry, and production rates of the well.

A second feature, combinable with any of the previous or following features, where the simulation output includes a flow capacity (kh) determined from permeability (k) values of the model.

A third feature, combinable with any of the previous or following features, where preparing the numerical model includes building the numerical model using geological data, geophysical data, petrophysical data, core data, PVT data, reservoir initial conditions data including pressure ($p_i$) and temperature ($T_i$) for each layer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data.

A fourth feature, combinable with any of the previous or following features, where providing the simulation output based on the simulations includes providing, for presentation to a user in a user interface: numerical comparisons of the pressures modeled in the functional numerical model and the transient pressures of the well; and graphical representations of log-log plot derivative matches.

A fifth feature, combinable with any of the previous or following features, where updating the numerical model includes: performing a quality assurance/quality control (QA/QC) check on the numerical model; determining whether the numerical model is within acceptable limits; upon determining that the numerical model is not within acceptable limits, adjusting properties used in the numerical model; and repeating the QA/QC check, the determining, and the adjusting until the numerical model is within acceptable limits.

A sixth feature, combinable with any of the previous or following features, the method further including incorporating, into the numerical model, reservoir structures interpreted from seismic data.

In a second implementation, a non-transitory, computer-readable medium storing one or more instructions executable by a computer system to perform operations including the following. A numerical model modeling production of a well is prepared using reservoir data and well data associated with the well. The numerical model is updated, including adjusting properties used for the numerical model, until results of performing a quality assurance/quality control (QA/QC) check on the numerical model indicate that the numerical model is within acceptable limits. Pressure derivatives are extracted from a transient test of the well to create a functional numerical model from the numerical model. Simulations are run on the functional numerical model and reservoir features and properties are adjusted until acceptable results are achieved on: 1) a pressure match between pressures modeled in the functional numerical model and transient pressures of the well, and 2) a log-log plot derivative match between a pressure derivative of the functional numerical model and a pressure derivative of the transient pressures of the well. A simulation output that is based on the simulations is provided.

The foregoing and other described implementations can each, optionally, include one or more of the following features:

A first feature, combinable with any of the following features, where performing the QA/QC check on the numerical model includes: determining that geological features including barriers, faults, fractures, and tight layers derived from seismic and geology data analysis of the well are incorporated correctly in the numerical model; and determining that reservoir properties from petrophysical log data, pressure/volume/temperature (PVT) data based on collected samples, and well data corresponding to well completion and production data of the well are in agreement with input well and reservoir properties; where reservoir properties include permeability, porosity, fluids saturation, saturation functions, relative permeability, fluids contacts, and reservoir initial conditions of the well; and where well data includes perforations, geometry, and production rates of the well.

A second feature, combinable with any of the previous or following features, where the simulation output includes a flow capacity (kh) determined from permeability (k) values of the model.

A third feature, combinable with any of the previous or following features, where preparing the numerical model includes building the numerical model using geological data, geophysical data, petrophysical data, core data, PVT data, reservoir initial conditions data including pressure ($p_i$) and temperature ($T_i$) for each layer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data.

A fourth feature, combinable with any of the previous or following features, where providing the simulation output based on the simulations includes providing, for presentation to a user in a user interface: numerical comparisons of the pressures modeled in the functional numerical model and the transient pressures of the well; and graphical representations of log-log plot derivative matches.

A fifth feature, combinable with any of the previous or following features, where updating the numerical model includes: performing a quality assurance/quality control (QA/QC) check on the numerical model; determining whether the numerical model is within acceptable limits; upon determining that the numerical model is not within acceptable limits, adjusting properties used in the numerical model; and repeating the QA/QC check, the determining, and the adjusting until the numerical model is within acceptable limits.

A sixth feature, combinable with any of the previous or following features, the operations further including incorporating, into the numerical model, reservoir structures interpreted from seismic data.

In a third implementation, a computer-implemented system, including one or more processors and a non-transitory computer-readable storage medium coupled to the one or more processors and storing programming instructions for execution by the one or more processors, the programming instructions instructing the one or more processors to perform operations including the following. A numerical model modeling production of a well is prepared using reservoir data and well data associated with the well. The numerical model is updated, including adjusting properties used for the numerical model, until results of performing a quality assurance/quality control (QA/QC) check on the numerical model indicate that the numerical model is within acceptable limits. Pressure derivatives are extracted from a transient test of the well to create a functional numerical model from the numerical model. Simulations are run on the functional numerical model and reservoir features and properties are adjusted until acceptable results are achieved on: 1) a pressure match between pressures modeled in the functional numerical model and transient pressures of the well, and 2) a log-log plot derivative match between a pressure derivative of the functional numerical model and a pressure derivative of the transient pressures of the well. A simulation output that is based on the simulations is provided.

The foregoing and other described implementations can each, optionally, include one or more of the following features:

A first feature, combinable with any of the following features, where performing the QA/QC check on the numerical model includes: determining that geological features including barriers, faults, fractures, and tight layers derived from seismic and geology data analysis of the well are incorporated correctly in the numerical model; and determining that reservoir properties from petrophysical log data, pressure/volume/temperature (PVT) data based on collected samples, and well data corresponding to well completion and production data of the well are in agreement with input well and reservoir properties; where reservoir properties include permeability, porosity, fluids saturation, saturation functions, relative permeability, fluids contacts, and reservoir initial conditions of the well; and where well data includes perforations, geometry, and production rates of the well.

A second feature, combinable with any of the previous or following features, where the simulation output includes a flow capacity (kh) determined from permeability (k) values of the model.

A third feature, combinable with any of the previous or following features, where preparing the numerical model includes building the numerical model using geological data, geophysical data, petrophysical data, core data, PVT data, reservoir initial conditions data including pressure ($p_i$) and temperature ($T_i$) for each layer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data.

A fourth feature, combinable with any of the previous or following features, where providing the simulation output based on the simulations includes providing, for presentation to a user in a user interface: numerical comparisons of the pressures modeled in the functional numerical model and the transient pressures of the well; and graphical representations of log-log plot derivative matches.

A fifth feature, combinable with any of the previous or following features, where updating the numerical model includes: performing a quality assurance/quality control (QA/QC) check on the numerical model; determining whether the numerical model is within acceptable limits; upon determining that the numerical model is not within acceptable limits, adjusting properties used in the numerical model; and repeating the QA/QC check, the determining, and the adjusting until the numerical model is within acceptable limits.

Implementations of the subject matter and the functional operations described in this specification can be implemented in digital electronic circuitry, in tangibly embodied computer software or firmware, in computer hardware, including the structures disclosed in this specification and their structural equivalents, or in combinations of one or more of them. Software implementations of the described subject matter can be implemented as one or more computer programs. Each computer program can include one or more modules of computer program instructions encoded on a tangible, non-transitory, computer-readable computer-storage medium for execution by, or to control the operation of, data processing apparatus. Alternatively, or additionally, the program instructions can be encoded in/on an artificially generated propagated signal. For example, the signal can be a machine-generated electrical, optical, or electromagnetic signal that is generated to encode information for transmission to a suitable receiver apparatus for execution by a data processing apparatus. The computer-storage medium can be a machine-readable storage device, a machine-readable storage substrate, a random or serial access memory device, or a combination of computer-storage mediums.

The terms "data processing apparatus," "computer," and "electronic computer device" (or equivalent as understood by one of ordinary skill in the art) refer to data processing hardware. For example, a data processing apparatus can encompass all kinds of apparatuses, devices, and machines for processing data, including by way of example, a programmable processor, a computer, or multiple processors or computers. The apparatus can also include special purpose logic circuitry including, for example, a central processing unit (CPU), a field-programmable gate array (FPGA), or an application-specific integrated circuit (ASIC). In some implementations, the data processing apparatus or special purpose logic circuitry (or a combination of the data processing apparatus or special purpose logic circuitry) can be hardware- or software-based (or a combination of both hardware- and software-based). The apparatus can optionally include code that creates an execution environment for computer programs, for example, code that constitutes processor firmware, a protocol stack, a database management system, an operating system, or a combination of execution environments. The present disclosure contemplates the use of data processing apparatuses with or without conventional operating systems, such as LINUX, UNIX, WINDOWS, MAC OS, ANDROID, or IOS.

A computer program, which can also be referred to or described as a program, software, a software application, a module, a software module, a script, or code, can be written in any form of programming language. Programming languages can include, for example, compiled languages, interpreted languages, declarative languages, or procedural languages. Programs can be deployed in any form, including as stand-alone programs, modules, components, subroutines, or units for use in a computing environment. A computer program can, but need not, correspond to a file in a file system. A program can be stored in a portion of a file that holds other programs or data, for example, one or more scripts stored in a markup language document, in a single file dedicated to the program in question, or in multiple coordinated files storing one or more modules, sub-programs, or portions of code. A computer program can be deployed for execution on one computer or on multiple computers that are located, for example, at one site or distributed across multiple sites that are interconnected by a communication network. While portions of the programs illustrated in the various figures may be shown as individual modules that implement the various features and functionality through various objects, methods, or processes, the programs can instead include a number of sub-modules, third-party services, components, and libraries. Conversely, the features and functionality of various components can be combined into single components as appropriate. Thresholds used to make computational determinations can be statically, dynamically, or both statically and dynamically determined.

The methods, processes, or logic flows described in this specification can be performed by one or more programmable computers executing one or more computer programs to perform functions by operating on input data and generating output. The methods, processes, or logic flows can also be performed by, and apparatus can also be implemented as, special purpose logic circuitry, for example, a CPU, an FPGA, or an ASIC.

Computers suitable for the execution of a computer program can be based on one or more of general and special purpose microprocessors and other kinds of CPUs. The elements of a computer are a CPU for performing or executing instructions and one or more memory devices for storing instructions and data. Generally, a CPU can receive instructions and data from (and write data to) a memory. A computer can also include, or be operatively coupled to, one or more mass storage devices for storing data. In some implementations, a computer can receive data from, and transfer data to, the mass storage devices including, for example, magnetic, magneto-optical disks, or optical disks. Moreover, a computer can be embedded in another device, for example, a mobile telephone, a personal digital assistant (PDA), a mobile audio or video player, a game console, a global positioning system (GPS) receiver, or a portable storage device such as a universal serial bus (USB) flash drive.

Computer-readable media (transitory or non-transitory, as appropriate) suitable for storing computer program instructions and data can include all forms of permanent/non-permanent and volatile/non-volatile memory, media, and memory devices. Computer-readable media can include, for example, semiconductor memory devices such as random access memory (RAM), read-only memory (ROM), phase change memory (PRAM), static random access memory (SRAM), dynamic random access memory (DRAM), erasable programmable read-only memory (EPROM), electrically erasable programmable read-only memory (EEPROM), and flash memory devices. Computer-readable media can also include, for example, magnetic devices such as tape, cartridges, cassettes, and internal/removable disks. Computer-readable media can also include magneto-optical disks and optical memory devices and technologies including, for example, digital video disc (DVD), CD-ROM, DVD+/-R, DVD-RAM, DVD-ROM, HD-DVD, and BLU-RAY. The memory can store various objects or data, including caches, classes, frameworks, applications, modules, backup data, jobs, web pages, web page templates, data structures, database tables, repositories, and dynamic information. Types of objects and data stored in memory can include parameters, variables, algorithms, instructions, rules, constraints, and references. Additionally, the memory can include logs, policies, security or access data, and reporting files. The processor and the memory can be supplemented by, or incorporated into, special purpose logic circuitry.

Implementations of the subject matter described in the present disclosure can be implemented on a computer having a display device for providing interaction with a user, including displaying information to (and receiving input from) the user. Types of display devices can include, for example, a cathode ray tube (CRT), a liquid crystal display (LCD), a light-emitting diode (LED), and a plasma monitor. Display devices can include a keyboard and pointing devices including, for example, a mouse, a trackball, or a trackpad. User input can also be provided to the computer through the use of a touchscreen, such as a tablet computer surface with pressure sensitivity or a multi-touch screen using capacitive or electric sensing. Other kinds of devices can be used to provide for interaction with a user, including to receive user feedback including, for example, sensory feedback including visual feedback, auditory feedback, or tactile feedback. Input from the user can be received in the form of acoustic, speech, or tactile input. In addition, a computer can interact with a user by sending documents to, and receiving documents from, a device that the user uses. For example, the computer can send web pages to a web browser on a user's client device in response to requests received from the web browser.

The term "graphical user interface," or "GUI," can be used in the singular or the plural to describe one or more graphical user interfaces and each of the displays of a particular graphical user interface. Therefore, a GUI can represent any graphical user interface, including, but not limited to, a web browser, a touch-screen, or a command line interface (CLI) that processes information and efficiently presents the information results to the user. In general, a GUI can include a plurality of user interface (UI) elements, some or all associated with a web browser, such as interactive fields, pull-down lists, and buttons. These and other UI elements can be related to or represent the functions of the web browser.

Implementations of the subject matter described in this specification can be implemented in a computing system that includes a back-end component, for example, as a data server, or that includes a middleware component, for example, an application server. Moreover, the computing system can include a front-end component, for example, a client computer having one or both of a graphical user interface or a Web browser through which a user can interact with the computer. The components of the system can be interconnected by any form or medium of wireline or wireless digital data communication (or a combination of data communication) in a communication network. Examples of communication networks include a local area network (LAN), a radio access network (RAN), a metropolitan area network (MAN), a wide area network (WAN), Worldwide Interoperability for Microwave Access (WIMAX), a wireless local area network (WLAN) (for example, using 802.11 a/b/g/n or 802.20 or a combination of protocols), all or a portion of the Internet, or any other communication system or systems at one or more locations (or a combination of communication networks). The network can communicate with, for example, Internet Protocol (IP) packets, frame relay frames, asynchronous transfer mode (ATM) cells, voice, video, data, or a combination of communication types between network addresses.

The computing system can include clients and servers. A client and server can generally be remote from each other and can typically interact through a communication network. The relationship of client and server can arise by virtue of computer programs running on the respective computers and having a client-server relationship.

Cluster file systems can be any file system type accessible from multiple servers for read and update. Locking or consistency tracking may not be necessary since the locking of exchange file system can be done at application layer. Furthermore, Unicode data files can be different from non-Unicode data files.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any suitable sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

Particular implementations of the subject matter have been described. Other implementations, alterations, and permutations of the described implementations are within the scope of the following claims as will be apparent to those skilled in the art. While operations are depicted in the drawings or claims in a particular order, this should not be understood as requiring that such operations be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations should not be understood as requiring such separation or integration in all implementations. It should be understood that the described program components and systems can generally be integrated together in a single software product or packaged into multiple software products.

Accordingly, the previously described example implementations do not define or constrain the present disclosure. Other changes, substitutions, and alterations are also possible without departing from the spirit and scope of the present disclosure.

Furthermore, any claimed implementation is considered to be applicable to at least a computer-implemented method; a non-transitory, computer-readable medium storing computer-readable instructions to perform the computer-implemented method; and a computer system including a computer memory interoperably coupled with a hardware processor configured to perform the computer-implemented method or the instructions stored on the non-transitory, computer-readable medium.

What is claimed is:

1. A computer-implemented method, comprising:
preparing, using observed dynamic reservoir data and well data associated with a well, a numerical model of the well that models production of the well;
updating the numerical model, including adjusting properties used for the numerical model until results of performing a quality assurance/quality control (QA/QC) check on the numerical model indicate that the numerical model is within acceptable limits;
extracting, during operation of an exploration oilfield containing the well, pressure derivatives from a transient test of the well to create a functional numerical model from the numerical model;
running simulations on the functional numerical model and adjusting reservoir features and properties until acceptable results are achieved, including:
receiving, from a user through a user interface, for each simulation of the simulations, at least one single parameter of the reservoir features and properties, wherein the at least one single parameter is one or more of a vertical permeability, a skin factor, and a distance to a fault;
adjusting, for each simulation of the simulations, the at least one single parameter of the reservoir features and properties, wherein the at least one single parameter includes one or both of a skin factor and a distance to a fault;
determining that running the simulations on the functional numerical model by adjusting one or both of the skin factor and the distance to a fault is not achieving the acceptable results;
adjusting, in response to determining that running the simulations on the functional numerical model is not achieving the acceptable results, a vertical permeability instead of one or both of the skin factor and the distance to a fault;
determining a pressure match between pressures modeled in the functional numerical model and transient pressures of the well, and comparing the pressure match against acceptable results; and determining a log-log plot derivative match between a pressure derivative of the functional numerical model and a pressure derivative of the transient pressures of the well, and comparing the log-log plot derivative match against acceptable results;

providing, for presentation to a user in a user interface, a simulation output based on the simulations, wherein the simulation output characterizes a reservoir and flow capacities during exploration in the exploration oilfield;

estimating flow capacities and oil production for the reservoir based on the simulation output, including determining a total flow capacity for the reservoir as a mathematical function of sum of products of a pay thickness of each layer of the reservoir and a permeability at each layer; and adjusting, based on estimates of flow capacities and oil production for the reservoir, drilling parameters for drilling the reservoirs and schedules for the drilling.

2. The computer-implemented method of claim 1, wherein performing the QA/QC check on the numerical model comprises:

determining that geological features including barriers, faults, fractures, and tight layers derived from seismic and geology data analysis of the well are incorporated correctly in the numerical model; and determining that reservoir properties from petrophysical log data, pressure/volume/temperature (PVT) data based on collected samples, and well data corresponding to well completion and production data of the well are in agreement with input well and reservoir properties;

wherein reservoir properties include permeability, porosity, fluids saturation, saturation functions, relative permeability, fluids contacts, and reservoir initial conditions of the well; and wherein well data includes perforations, geometry, and production rates of the well.

3. The computer-implemented method of claim 1, wherein the simulation output includes a flow capacity (kh) determined from permeability (k) values of the model.

4. The computer-implemented method of claim 1, wherein preparing the numerical model includes building the numerical model using geological data, geophysical data, petrophysical data, core data, PVT data, reservoir initial conditions data including pressure ($p_i$) and temperature ($T_i$) for each layer indexed by integer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data.

5. The computer-implemented method of claim 1, wherein providing the simulation output based on the simulations includes providing, for presentation to the user in the user interface:

numerical comparisons of the pressures modeled in the functional numerical model and the transient pressures of the well; and graphical representations of log-log plot derivative matches.

6. The computer-implemented method of claim 1, wherein updating the numerical model comprises:

performing a quality assurance/quality control (QA/QC) check on the numerical model;

determining whether the numerical model is within acceptable limits;

upon determining that the numerical model is not within acceptable limits, adjusting properties used in the numerical model; and repeating the QA/QC check, the determining, and the adjusting until the numerical model is within acceptable limits.

7. The computer-implemented method of claim 1, further comprising incorporating, into the numerical model, reservoir structures interpreted from seismic data.

8. A non-transitory, computer-readable medium storing one or more instructions executable by a computer system to perform operations comprising:

preparing, using observed dynamic reservoir data and well data associated with a well, a numerical model of the well that models production of the well;

updating the numerical model, including adjusting properties used for the numerical model until results of performing a quality assurance/quality control (QA/QC) check on the numerical model indicate that the numerical model is within acceptable limits;

extracting, during operation of an exploration oilfield containing the well, pressure derivatives from a transient test of the well to create a functional numerical model from the numerical model;

running simulations on the functional numerical model and adjusting reservoir features and properties until acceptable results are achieved, including:

receiving, from a user through a user interface, for each simulation of the simulations, at least one single parameter of the reservoir features and properties, wherein the at least one single parameter is one or more of a vertical permeability, a skin factor, and a distance to a fault;

adjusting, for each simulation of the simulations, the at least one single parameter of the reservoir features and properties, wherein the at least one single parameter includes one or both of a skin factor and a distance to a fault;

determining that running the simulations on the functional numerical model by adjusting one or both of the skin factor and the distance to a fault is not achieving the acceptable results;

adjusting, in response to determining that running the simulations on the functional numerical model is not achieving the acceptable results, a vertical permeability instead of one or both of the skin factor and the distance to a fault;

determining a pressure match between pressures modeled in the functional numerical model and transient pressures of the well, and comparing the pressure match against acceptable results; and determining a log-log plot derivative match between a pressure derivative of the functional numerical model and a pressure derivative of the transient pressures of the well, and comparing the log-log plot derivative match against acceptable results;

providing, for presentation to a user in a user interface, a simulation output based on the simulations, wherein the simulation output characterizes a reservoir and flow capacities during exploration in the exploration oilfield;

estimating flow capacities and oil production for the reservoir based on the simulation output, including determining a total flow capacity for the reservoir as a mathematical function of sum of products of a pay thickness of each layer of the reservoir and a permeability at each layer; and adjusting, based on estimates of flow capacities and oil production for the reservoir, drilling parameters for drilling the reservoirs and schedules for the drilling.

9. The non-transitory, computer-readable medium of claim 8, wherein performing the QA/QC check on the numerical model comprises:

determining that geological features including barriers, faults, fractures, and tight layers derived from seismic and geology data analysis of the well are incorporated correctly in the numerical model; and determining that reservoir properties from petrophysical log data, pressure/volume/temperature (PVT) data based on collected samples, and well data corresponding to well completion and production data of the well are in agreement with input well and reservoir properties;

wherein reservoir properties include permeability, porosity, fluids saturation, saturation functions, relative permeability, fluids contacts, and reservoir initial conditions of the well; and wherein well data includes perforations, geometry, and production rates of the well.

10. The non-transitory, computer-readable medium of claim 8, wherein the simulation output includes a flow capacity (kh) determined from permeability (k) values of the model.

11. The non-transitory, computer-readable medium of claim 8, wherein preparing the numerical model includes building the numerical model using geological data, geophysical data, petrophysical data, core data, PVT data, reservoir initial conditions data including pressure ($p_i$) and temperature ($T_i$) for each layer indexed by integer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data.

12. The non-transitory, computer-readable medium of claim 8, wherein providing the simulation output based on the simulations includes providing, for presentation to the user in the user interface:

numerical comparisons of the pressures modeled in the functional numerical model and the transient pressures of the well; and graphical representations of log-log plot derivative matches.

13. The non-transitory, computer-readable medium of claim 8, wherein updating the numerical model comprises:

performing a quality assurance/quality control (QA/QC) check on the numerical model;

determining whether the numerical model is within acceptable limits;

upon determining that the numerical model is not within acceptable limits, adjusting properties used in the numerical model; and repeating the QA/QC check, the determining, and the adjusting until the numerical model is within acceptable limits.

14. The non-transitory, computer-readable medium of claim 8, the operations further comprising incorporating, into the numerical model, reservoir structures interpreted from seismic data.

15. A computer-implemented system, comprising:
one or more processors; and
a non-transitory computer-readable storage medium coupled to the one or more processors and storing programming instructions for execution by the one or more processors, the programming instructions instructing the one or more processors to perform operations comprising:

preparing, using observed dynamic reservoir data and well data associated with a well, a numerical model of the well that models production of the well;

updating the numerical model, including adjusting properties used for the numerical model until results of performing a quality assurance/quality control (QA/QC) check on the numerical model indicate that the numerical model is within acceptable limits;

extracting, during operation of an exploration oilfield containing the well, pressure derivatives from a transient test of the well to create a functional numerical model from the numerical model;

running simulations on the functional numerical model and adjusting reservoir features and properties until acceptable results are achieved, including:

receiving, from a user through a user interface, for each simulation of the simulations, at least one single parameter of the reservoir features and properties, wherein the at least one single parameter is one or more of a vertical permeability, a skin factor, and a distance to a fault;

adjusting, for each simulation of the simulations, the at least one single parameter of the reservoir features and properties, wherein the at least one single parameter includes one or both of a skin factor and a distance to a fault;

determining that running the simulations on the functional numerical model by adjusting one or both of the skin factor and the distance to a fault is not achieving the acceptable results;

adjusting, in response to determining that running the simulations on the functional numerical model is not achieving the acceptable results, a vertical permeability instead of one or both of the skin factor and the distance to a fault;

determining a pressure match between pressures modeled in the functional numerical model and transient pressures of the well, and comparing the pressure match against acceptable results; and determining a log-log plot derivative match between a pressure derivative of the functional numerical model and a pressure derivative of the transient pressures of the well, and comparing the log-log plot derivative match against acceptable results;

providing, for presentation to a user in a user interface, a simulation output based on the simulations, wherein the simulation output characterizes a reservoir and flow capacities during exploration in the exploration oilfield;

estimating flow capacities and oil production for the reservoir based on the simulation output, including determining a total flow capacity for the reservoir as a mathematical function of sum of products of a pay thickness of each layer of the reservoir and a permeability at each layer; and adjusting, based on estimates of flow capacities and oil production for the reservoir, drilling parameters for drilling the reservoirs and schedules for the drilling.

16. The computer-implemented system of claim 15, wherein performing the QA/QC check on the numerical model comprises:

determining that geological features including barriers, faults, fractures, and tight layers derived from seismic and geology data analysis of the well are incorporated correctly in the numerical model; and determining that reservoir properties from petrophysical log data, pressure/volume/temperature (PVT) data based on collected samples, and well data corresponding to well completion and production data of the well are in agreement with input well and reservoir properties;

wherein reservoir properties include permeability, porosity, fluids saturation, saturation functions, relative permeability, fluids contacts, and reservoir initial conditions of the well; and wherein well data includes perforations, geometry, and production rates of the well.

17. The computer-implemented system of claim 15, wherein the simulation output includes a flow capacity (kh) determined from permeability (k) values of the model.

18. The computer-implemented system of claim 15, wherein preparing the numerical model includes building the numerical model using geological data, geophysical data, petrophysical data, core data, PVT data, reservoir initial conditions data including pressure ($p_i$) and temperature ($T_i$) for each layer indexed by integer i, fluids contacts data including gas-oil contact (GOC) and oil-water contact (OWC) data, reference point data, capillary pressure ($p_c$) function data, relative permeability ($k_r$) data, well trajectory and completion data, and well control data, transient test data, and productions rates data.

19. The computer-implemented system of claim 15, wherein providing the simulation output based on the simulations includes providing, for presentation to the user in the user interface:

numerical comparisons of the pressures modeled in the functional numerical model and the transient pressures of the well; and graphical representations of log-log plot derivative matches.

20. The computer-implemented system of claim 15, wherein updating the numerical model comprises:

performing a quality assurance/quality control (QA/QC) check on the numerical model;

determining whether the numerical model is within acceptable limits;

upon determining that the numerical model is not within acceptable limits, adjusting properties used in the numerical model; and repeating the QA/QC check, the determining, and the adjusting until the numerical model is within acceptable limits.

* * * * *